United States Patent
Lee et al.

(10) Patent No.: US 10,701,638 B2
(45) Date of Patent: Jun. 30, 2020

(54) METHOD AND APPARATUS FOR REDUCING ENERGY CONSUMPTION OF TERMINAL IN WIRELESS COMMUNICATION SYSTEM

(71) Applicant: Samsung Electronics Co., Ltd., Suwon-si, Gyeonggi-do (KR)

(72) Inventors: Kwonjong Lee, Suwon-si (KR); Byungju Lee, Suwon-si (KR); Hyojin Lee, Suwon-si (KR); Younsun Kim, Suwon-si (KR); Juho Lee, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 16/549,999

(22) Filed: Aug. 23, 2019

(65) Prior Publication Data
US 2020/0068492 A1    Feb. 27, 2020

(30) Foreign Application Priority Data
Aug. 23, 2018  (KR) .................. 10-2018-0098770

(51) Int. Cl.
| | | |
|---|---|---|
| H04W 52/02 | (2009.01) | |
| H04M 1/73 | (2006.01) | |
| H04W 52/26 | (2009.01) | |

(52) U.S. Cl.
CPC ..... *H04W 52/0261* (2013.01); *H04W 52/262* (2013.01)

(58) Field of Classification Search
CPC ........... H04W 52/0261; H04W 52/262; H04W 52/02; H04B 1/1615; H04B 7/0693; H04B 7/0877; H04M 1/73
See application file for complete search history.

(56) References Cited

U.S. PATENT DOCUMENTS

| | | | |
|---|---|---|---|
| 9,331,780 B1* | 5/2016 | Zhou | H04B 10/25 |
| 9,660,692 B2* | 5/2017 | Bruchner | H04B 1/709 |
| 2003/0081692 A1 | 5/2003 | Kwan et al. | |
| 2005/0219108 A1* | 10/2005 | Piasecki | H03M 1/124 |
| | | | 341/163 |
| 2005/0254561 A1* | 11/2005 | Seo | H04B 1/0003 |
| | | | 375/219 |
| 2011/0039509 A1* | 2/2011 | Bruchner | H04B 1/40 |
| | | | 455/232.1 |
| 2015/0098342 A1 | 4/2015 | Tabet et al. | |
| 2016/0028578 A1 | 1/2016 | Ramakrishna | |
| 2016/0050024 A1* | 2/2016 | Kaneda | H04B 10/6161 |
| | | | 398/208 |
| 2016/0087752 A1 | 3/2016 | Xia et al. | |
| 2018/0070306 A1 | 3/2018 | Ang et al. | |

OTHER PUBLICATIONS

ISA/KR, International Search Report and Written Opinion of the International Searching Authority, International Application No. PCT/KR2019/010764, Jan. 2, 2020, 12 pages.

Huawei et al., "Remaining details of evaluation methodology for short TTI in R15 sidelink," R1-1707005, 3GPP TSG RAN WG1 Meeting #89, Hangzhou, China, May 15-19, 2017, 4 pages.

\* cited by examiner

*Primary Examiner* — Andrew Wendell

(57) ABSTRACT

A terminal may obtain a parameter related to energy consumption of the terminal, determine a bit resolution value of an analog-to-digital converter (ADC) of the terminal for reducing the energy consumption of the terminal, and set the bit resolution value of the ADC as the determined bit resolution value.

19 Claims, 25 Drawing Sheets

FIG. 21

| CQI index | modulation | code rate x 1024 | efficiency |
|---|---|---|---|
| 0 | out of range | | |
| 1 | QPSK | 78 | 0.1523 |
| 2 | QPSK | 193 | 0.377 |
| 3 | QPSK | 449 | 0.877 |
| 4 | 16QAM | 378 | 1.4766 |
| 5 | 16QAM | 490 | 1.9141 |
| 6 | 16QAM | 616 | 2.4063 |
| 7 | 64QAM | 466 | 2.7305 |
| 8 | 64QAM | 567 | 3.3223 |
| 9 | 64QAM | 666 | 3.9023 |
| 10 | 64QAM | 772 | 4.5234 |
| 11 | 64QAM | 873 | 5.1152 |
| 12 | 256QAM | 711 | 5.5547 |
| 13 | 256QAM | 797 | 6.2266 |
| 14 | 256QAM | 885 | 6.9141 |
| 15 | 256QAM | 948 | 7.4063 |

FIG. 22

| $I_{MCS}$ | $Q_m$ | R | Spectral efficiency | $I_{MCS}$ | $Q_m$ | R | Spectral efficiency |
|---|---|---|---|---|---|---|---|
| 0 | 2 | 120 | 0.2344 | 16 | 6 | 719 | 4.2129 |
| 1 | 2 | 193 | 0.377 | 17 | 6 | 772 | 4.5234 |
| 2 | 2 | 308 | 0.6016 | 18 | 6 | 822 | 4.8164 |
| 3 | 2 | 449 | 0.877 | 19 | 6 | 873 | 5.1152 |
| 4 | 2 | 602 | 1.1758 | 20 | 8 | 682.5 | 5.332 |
| 5 | 4 | 378 | 1.4766 | 21 | 8 | 711 | 5.5547 |
| 6 | 4 | 434 | 1.6953 | 22 | 8 | 754 | 5.8906 |
| 7 | 4 | 490 | 1.9141 | 23 | 8 | 797 | 6.2266 |
| 8 | 4 | 553 | 2.1602 | 24 | 8 | 841 | 6.5703 |
| 9 | 4 | 616 | 2.4063 | 25 | 8 | 885 | 6.9141 |
| 10 | 4 | 658 | 2.5703 | 26 | 8 | 916.5 | 7.1602 |
| 11 | 6 | 466 | 2.7305 | 27 | 8 | 948 | 7.4063 |
| 12 | 6 | 517 | 3.0293 | 28 | 2 | Reserved | |
| 13 | 6 | 567 | 3.3223 | 29 | 4 | Reserved | |
| 14 | 6 | 616 | 3.6094 | 30 | 6 | Reserved | |
| 15 | 6 | 666 | 3.9023 | 31 | 8 | Reserved | |

METHOD AND APPARATUS FOR REDUCING ENERGY CONSUMPTION OF TERMINAL IN WIRELESS COMMUNICATION SYSTEM

CROSS-REFERENCE TO RELATED APPLICATION

This application is based on and claims priority under 35 U.S.C. § 119 to Korean Patent Application No. 10-2018-0098770, filed on Aug. 23, 2018, in the Korean Intellectual Property Office, the disclosure of which is incorporated by reference herein in its entirety.

BACKGROUND

1. Field

The disclosure relates to a method of reducing energy consumption when a terminal receives data in a wireless communication system.

2. Description of Related Art

In order to meet the increasing demand with respect to wireless data traffic because of the commercialization of 4G communication systems, efforts have been made to develop improved 5G communication systems or pre-5G communication systems. For this reason, 5G communication systems or pre-5G communication systems are called Beyond 4G network communication systems or Post Long Term Evolution (LTE) systems. In order to achieve a high data transfer rate, consideration is given to implementing 5G communication systems in millimeter wave (mmW) frequency bands (e.g., 60 or 70 GHz bands). In order to reduce propagation path loss and increase a propagation distance in the millimeter wave frequency bands, in 5G communication systems, discussions are underway about technologies such as beam-forming, massive multiple-input and multiple-output (MIMO), full dimensional MIMO (FD-MIMO), array antenna, analog beam-forming, and large scale antenna. Also, in order to improve networks of systems, in 5G communication systems, developments of technologies such as evolved small cell, advanced small cell, cloud radio access network (cloud RAN), ultra-dense network, device to device communication (D2D), wireless backhaul, moving network, cooperative communication, coordinated multi-points (CoMP), and interference cancellation are underway. Furthermore, in 5G communication systems, developments of an advanced coding modulation (ACM) scheme such as hybrid FSK and QAM modulation (FQAM) or sliding window superposition coding (SWSC) and an enhanced network access scheme such as filter bank multi-carrier (FBMC), non-orthogonal multiple access (NOMA), or sparse code multiple access (SCMA) are underway.

The Internet is evolving from a human-centered connection network through which humans create and consume information to an Internet of Things (IoT) network through which distributed elements, such as objects, exchange and process information. Internet of Everything (IoE) technology, which is a combination of IoT technology and big data processing technology through connection with a cloud server, is also emerging. In order to implement the IoT, technology elements such as sensing technology, wired/wireless communication and network infrastructure, service interface technology, and security technology are required, and thus, technology for inter-object connection, such as a sensor network, machine to machine (M2M) communication, or machine type communication (MTC), has recently been studied. In an IoT environment, intelligent Internet technology (IT) services that collect and analyze data generated by connected objects and create new value in human life may be provided. The IoT may be applied to fields such as smart homes, smart buildings, smart cities, smart cars or connected cars, smart grids, health care, smart home appliances, and advanced medical services through convergence and integration of existing information technology (IT) and various industries.

Various attempts are made to apply 5G communication systems to IoT networks. For example, technology such as a sensor network, M2M communication, or MTC is implemented by 5G communication technology such as beam-forming, MIMO, or array antenna. The application of a cloud RAN as big data processing technology may also be considered as an example of convergence of 3eG technology and IoT technology.

Because mobile communication systems may provide various services due to the development of the mobile communication systems, there are demands for methods of effectively providing the services.

SUMMARY

Provided are an apparatus and method of effectively reducing energy consumption of a terminal in a wireless communication system.

Additional aspects will be set forth in part in the description which follows and, in part, will be apparent from the description, or may be learned by practice of the presented embodiments of the disclosure.

According to some embodiments of the disclosure, an operation method of a terminal for reducing energy consumption of the terminal by adjusting a bit resolution value of an analog-to-digital converter (ADC) includes: obtaining a parameter related to the energy consumption of the terminal; determining the bit resolution value of the ADC for reducing the energy consumption of the terminal, based on the obtained parameter; and setting the bit resolution value of the ADC as the determined bit resolution value.

The parameter related to the energy consumption of the terminal may include, a maximum modulation and coding scheme (MCS) value and a channel quality indicator (CQI) value corresponding to the maximum MCS value usable by the base station for the terminal so that a transmission error of a signal received from the base station is equal to or less than a specific error rate according to the bit resolution value of the ADC.

The parameter related to the energy consumption of the terminal may further include at least one of a channel intensity between the base station and the terminal, an intensity of interference with the signal received from the base station, thermal noise of the signal received from the base station, an energy consumption amount of the terminal, a residual energy amount of the terminal, a bit resolution range settable by the ADC, or a signal-to-quantization noise ratio (SQNR) of the signal received from the base station according to the bit resolution value of the ADC.

The determining of the bit resolution value of the ADC for reducing the energy consumption of the terminal may include determining the bit resolution value of the ADC for reducing the energy consumption of the terminal by comparing the obtained parameter with a pre-set threshold value.

The operation method may further include transmitting, to the base station, the maximum MCS value according to the determined bit resolution value or the CQI value corresponding to the maximum MCS value according to the determined bit resolution value.

The operation method may further include measuring a CQI value; and reporting, to the base station, a smaller value between the measured CQI value and the CQI value corresponding to the maximum MCS value according to the determined bit resolution value as the CQI value.

The operation method may further include receiving, from the base station, data encoded according to an MCS value determined by the base station, wherein a smaller value between an MCS value corresponding to the reported CQI value and the maximum MCS value according to the determined bit resolution value is determined by the base station as the determined MCS value.

The determining of the bit resolution value of the ADC for reducing the energy consumption of the terminal may include: transmitting the obtained parameter to a base station; receiving, from the base station, the bit resolution value of the ADC for reducing the energy consumption of the terminal determined by the base station based on the obtained parameter; and determining the bit resolution value of the ADC for reducing the energy consumption of the terminal as the received bit resolution value.

According to other embodiments of the disclosure, an operation method of a base station (BS) for reducing energy consumption of a terminal by adjusting a bit resolution value of an analog-to-digital converter (ADC) of the terminal includes: receiving, from the terminal, at least one of a maximum modulation and coding scheme (MCS) value or a channel quality indicator (CQI) value corresponding to the maximum MCS value usable by the base station for the terminal according to the bit resolution value of the ADC for reducing the energy consumption of the terminal; and determining an MCS value, based on at least one of the maximum MCS value or the CQI value corresponding to the maximum MCS value.

The maximum MCS value and the CQI value corresponding to the maximum MCS value may be obtained by the terminal, wherein the maximum MCS value is the maximum MCS value usable by the base station for the terminal so that a transmission error of a signal received by the terminal from the base station is equal to or less than a specific error rate, according to the bit resolution value of the ADC for reducing the energy consumption of the terminal.

The bit resolution value of the ADC for reducing the energy consumption of the terminal may be determined by the terminal, based on a parameter related to the energy consumption of the terminal obtained by the terminal.

The parameter related to the energy consumption of the terminal may include the maximum modulation and coding scheme (MCS) value and the channel quality indicator (CQI) value corresponding to the maximum MCS value usable by the base station for the terminal so that a transmission error of a signal received from the base station is equal to or less than a specific error rate according to the bit resolution value of the ADC.

The parameter related to the energy consumption of the terminal may further include at least one of a channel intensity between the base station and the terminal, an intensity of interference with the signal received from the base station, thermal noise of the signal received from the base station, an energy consumption amount of the terminal, a residual energy amount of the terminal, a bit resolution range settable by the ADC, or a signal-to-quantization noise ratio (SQNR) of the signal received from the base station according to the bit resolution value of the ADC.

The bit resolution value of the ADC for reducing the energy consumption of the terminal may be determined by the terminal by comparing the measured parameter with a pre-set threshold value.

The operation method may further include: receiving, from the terminal, a parameter related to the energy consumption of the terminal obtained by the terminal; determining the bit resolution value of the ADC for reducing the energy consumption of the terminal, based on the received parameter; and transmitting the determined bit resolution value to the terminal.

The operation method may further include receiving a smaller value, between a CQI value measured by the terminal and the CQI value corresponding to the maximum MCS value, reported as a CQI value from the terminal, wherein the determining of the MCS value includes determining a smaller value between an MCS value corresponding to the reported CQI value and the maximum MCS value as the MCS value.

The operation method may further include encoding data according to the determined MCS value; and transmitting the data encoded according to the determined MCS value to the terminal.

According to other embodiments of the disclosure, a terminal includes: a transceiver; at least one memory configured to store a program for reducing energy consumption of the terminal by adjusting a bit resolution value of an analog-to-digital converter (ADC); and at least one processor configured to control, by executing the program, a parameter related to the energy consumption of the terminal to be obtained, the bit resolution value of the ADC for reducing the energy consumption of the terminal to be determined based on the obtained parameter, and the bit resolution value of the ADC to be set as the determined value.

According to other embodiments of the disclosure, a base station (BS) includes: a transceiver; at least one memory configured to store a program for reducing energy consumption of a terminal by adjusting a bit resolution value of an analog-to-digital converter (ADC) of the terminal; and at least one processor configured to, by executing the program, receive, from the terminal, at least one of a maximum modulation and coding scheme (MCS) value or a channel quality indicator (CQI) value corresponding to the maximum MCS value usable by the base station for the terminal according to the bit resolution value of the ADC for reducing the energy consumption of the terminal and determine an MCS value based on at least one of the maximum MCS value or the CQI value corresponding to the maximum MCS value.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 21 illustrates a diagram of an example where a channel quality indicator (CQI) value usable by a base station is limited according to an energy saving operation of a terminal according to some embodiments of the disclosure;

FIG. 22 illustrates a diagram of an example where a modulation and coding scheme (MCS) value usable by a base station is limited according to an energy saving operation of a terminal according to some embodiments of the disclosure;

DETAILED DESCRIPTION

Figure 1:
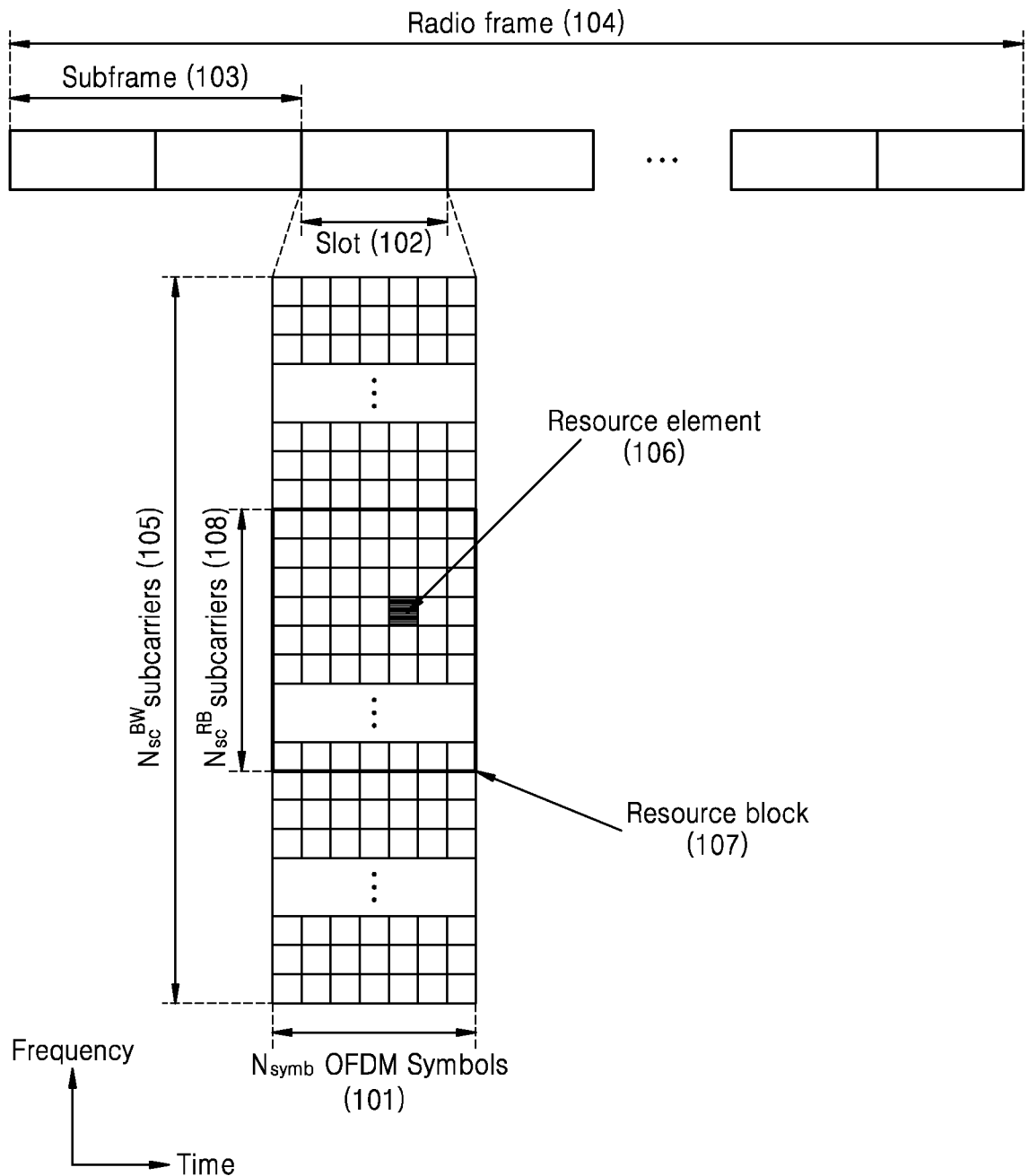
FIG. 1 illustrates a diagram of a basic structure of a time-frequency domain that is a radio resource domain where data or a control channel is transmitted in an LTE system, an LTE-A system, a 5G system, or the like according to some embodiments of the disclosure.

FIGS. 1 through 25, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Throughout the disclosure, the expression "at least one of a, b or c" indicates only a, only b, only c, both a and b, both a and c, both b and c, all of a, b, and c, or variations thereof.

Embodiments of the disclosure will now be described more fully with reference to the accompanying drawings.

In describing the disclosure, related well-known functions or configurations incorporated herein are not described in detail in the case where it is determined that they obscure the subject matter of the disclosure in unnecessary detail. The following terms are defined in consideration of functions in the disclosure, and may vary according to the intention of users or operators, precedents, etc. Accordingly, the specific terms used herein should be understood based on the whole context of the disclosure.

The advantages and features of the disclosure and methods of achieving the advantages and features will be described more fully with reference to the accompanying drawings, in which embodiments of the disclosure are shown. The disclosure may, however, be embodied in many different forms and should not be construed as being limited to the embodiments of the disclosure; rather these embodiments of the disclosure are provided so that this disclosure will be thorough and complete, and will fully convey the concept of the disclosure defined by the following claims to one of ordinary skill in the art. In the specification, the same elements are denoted by the same reference numerals.

It will be understood that each block of the flowchart illustrations, and combinations of blocks in the flowchart illustrations, may be implemented by computer program instructions. The computer program instructions may be provided to a processor of a general-purpose computer, special purpose computer, or other programmable data processing apparatus, such that the instructions, which are executed via the processor of the computer or other programmable data processing apparatus, generate means for implementing the functions specified in the flowchart block or blocks. The computer program instructions may also be stored in a computer usable or computer-readable memory that may direct a computer or other programmable data processing apparatus to function in a particular manner, such that the instructions stored in the computer usable or computer-readable memory produce an article of manufacture including instruction means that implement the functions specified in the flowchart block or blocks. The computer program instructions may also be loaded onto a computer or other programmable data processing apparatus to cause a series of operational steps to be performed on the computer or other programmable apparatus to produce a computer implemented process such that the instructions that are executed on the computer or other programmable apparatus provide steps for implementing the functions specified in the flowchart block or blocks.

In addition, each block of the flowchart illustrations may represent a module, segment, or portion of code, which includes one or more executable instructions for implementing specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

The term "~j unit", as used in the present embodiment of the disclosure, means, but is not limited to, a software or hardware component, such as field-programmable gate array (FPGA) or application-specific integrated circuit (ASIC), which performs certain tasks. However, "~unit" does not mean to be limited to software or hardware. The term "~unit" may be configured to be in an addressable storage medium or configured to operate one or more processors. Thus, "~unit" may include, by way of example, components, such as software components, object-oriented software components, class components, and task components, processes, functions, attributes, procedures, subroutines, segments of program code, drivers, firmware, microcode, circuitry, data, databases, data structures, tables, arrays, and variables. The functionality provided in the components and "~units" may be combined into fewer components and "~units" or further separated into additional components and "~units". Further, the components and "~units" may be implemented to operate one or more central processing units (CPUs) in a device or a security multimedia card. Also, a unit may include one or more processors in an embodiment of the disclosure.

Hereinafter, the operation principle of the disclosure will be described in detail with reference to the accompanying drawings. In describing the disclosure, related well-known functions or configurations incorporated herein are not described in detail in the case where it is determined that they obscure the subject matter of the disclosure in unnecessary detail. Hereinafter, embodiments of the disclosure will be described with reference to the accompanying drawings.

Hereinafter, terms indicating a connection node, terms indicating network entities, terms indicating an interface between network entities, and terms indicating various pieces of identification information, as used in the following description, are exemplified for convenience of explanation. Accordingly, the disclosure is not limited to the terms to be described later, but other terms indicating objects having equal technical meanings may be used.

Hereinafter, for convenience of explanation, terms and titles that are defined in the $3^{rd}$ generation partnership project long term evolution (3GPP LTE) standards are used in the disclosure. However, the disclosure is not limited to the above terms and names, and may also be applied to systems following other standards. In the disclosure, an eNB may be interchangeably used with a gNB for convenience of explanation. That is, a base station (BS) described as an eNB may refer to a gNB. Also, the term "terminals" may refer to not only mobile phones, NB-IoT devices, and sensors but also other wireless communication devices.

Hereinafter, a base station is a subject that allocates resources to a terminal and may be at least one of a gNode b, an eNode B, a Node B, a base station, a radio access unit, a base station controller, or a node on a network. Examples of a terminal may include user equipment (UE), a mobile station (MS), a cellular phone, a smartphone, a computer, and a multimedia system capable of performing a communication function. The disclosure is not limited to the above examples.

In particular, the disclosure may be applied to 3GPP New Radio (NR) ($5^{th}$ generation (5G) mobile communication standard). Also, the disclosure may be applied to intelligent services (e.g., smart homes, smart buildings, smart cities, smart cars or connected cars, health care, digital education, retail business, and security and safety related services) based on 5G. communication technology and IoT related technology. In the disclosure, an eNB may be interchangeably used with a gNB for convenience of explanation. That is, a base station described as an eNB may refer to a gNB. Also, the term "terminals" may refer to not only mobile phones, NB-IoT devices, and sensors but also other wireless communication devices.

Wireless communication systems have been developed from wireless communication systems providing voice centered services in the early stage toward broadband wireless communication systems providing high-speed, high-quality packet data services, like communication standards of high speed packet access (HSPA), long term evolution (LIE or evolved universal terrestrial radio access (E-UTRA)), LTE-advanced (LTE-A), and LTE-Pro of the 3GPP, high rate packet data (HRPM) and ultra mobile broadband (UMB) of 3GPP2, IEEE 802.16e or the like.

As a representative example of the broadband wireless communication system, the LTE system has adopted an orthogonal frequency division multiplexing (OFDM) scheme in a downlink (DL) and has adopted a single carrier frequency division multiple access (SC-FDMA) scheme in an uplink (UL). The UL refers to a radio link through which UE or an MS transmits data or a control signal to a base station (e.g., eNodeB), and the DL refers to a radio link through which a base station transmits data or a control signal to a terminal. The multiple access scheme as described above normally allocates and operates time-frequency resources including data or control information to be transmitted to each other to prevent the time-frequency resources from overlapping with each other, that is, establish orthogonality, thereby dividing the data or the control information of each user.

As a future communication system after the LTE system, that is, a 5G communication system, has to be able to freely reflect various requirements of a user and a service provider, and thus service satisfying various requirements at the same time need to be supported. The services considered for the 5G communication system include enhanced mobile broadband (eMBB), massive machine type communication (mMTC), ultra reliability low latency communication (hereinafter, URLLC), etc.

According to some embodiments of the disclosure, the eMBB aims to provide a higher data transfer rate than a data transfer rate supported by the LTE, LTE-A, or LTE-Pro system. For example, in the 5G communication system, the eMBB should be able to provide a peak data rate of 20 Gbps in the DL and a peak data rate of 10 Gbps in the UL from the viewpoint of one base station. In addition, the 5G communication system should provide the increased user perceived data rate of the terminal simultaneously with providing the peak data rate. In order to satisfy such requirements, improvement of various transmitting/receiving technologies including a further improved multiple-input and multiple-output (MIMO) transmission technology may be demanded. In addition, signals are transmitted using a transmission bandwidth of up to 20 MHz in a 2 GHz band used by the current LTE system, but the 5G communication system uses a bandwidth wider than 20 MHz in a frequency band of 3 to 6 GHz or more than 6 GHz, thereby satisfying a data transmission rate required in the 5G communication system.

At the same time, the mMTC is being considered to support application services such as Internet of Things (IoT) in the 5G communication system. The mMTC is required for an access support of a large-scale terminal in a cell, coverage enhancement of a terminal, improved battery time, and cost reduction of a terminal in order to efficiently provide the IoT. The IoT needs to be able to support a large number of terminals (e.g., 1,000,000 terminals/$km^2$) in a cell because it is attached to various sensors and various devices to provide communication functions. In addition, the terminals supporting the mMTC are more likely to be positioned in shaded areas not covered by a cell, such as an underground of a building due to nature of services, and thus, the terminal requires a wider coverage than other services provided by the 5G communication system. The terminals that support the mMTC should be configured as inexpensive terminals and require very long battery lifetime, such as 10 to 15 years, because it is difficult to frequently replace batteries of the terminals.

Finally, the URLLC that is a cellular-based wireless communication service used for mission-critical purposes may be used, for example, in remote control for robots or machinery, industrial automation, unmanaged aerial vehicles, remote health care, or emergency alert. Accordingly, communication provided by the URLLC should provide very low latency (ultra low latency) and very high reliability (ultra high reliability). For example, URLLC-supportive services need to meet an air interface latency of less than 0.5 milliseconds simultaneously with a packet error rate of $10^{-5}$ or less. Accordingly, for URLLC-supportive services, the 5G system may be required to provide a transmit time interval (TTI) shorter than those for other services while securing reliable communication links by allocating a broad resource in a frequency band.

The three services, that is, eMBB, URLLC, and mMTC, considered in the above 5G communication system may be multiplexed in one system and may be transmitted. In this case, the services may use different transmission/reception methods and transmission/reception parameters in order to meet their different requirements. However, the mMTC, URLLC, and eMBB are examples of different service types, and service types to which the disclosure is applied are not limited thereto.

Also, although embodiments of the disclosure are described by using the LTE, LTE-A, LTE Pro, or 5G (or NR) system, the embodiments of the disclosure may be applied to other communication systems having a similar technical background or channel type. Also, it will be understood by one of ordinary skill in the art that embodiments of the disclosure may be applied to other communication systems through some modifications without departing from the scope of the disclosure.

Hereinafter, a frame structure of the LIE, LTE-A, or 5G system will be described in more detail with reference to the drawings.

FIG. 1 illustrates a diagram of a basic structure of a time-frequency domain that is a radio resource domain where data or a control channel is transmitted in an LTE system, an LTE-A system, a 5G system, or the like according to some embodiments of the disclosure.

In FIG. 1, the horizontal axis represents a time domain and the vertical axis represents a frequency domain. In the time domain, a minimum transmission unit is an OFDM symbol, and $N_{symb}$ (101) symbols may constitute one slot 102 and two slots may constitute one subframe 103. A length of the slot 102 may be 0.5 ms, and a length of the subframe 103 may be 1.0 ms. A radio frame 104 is a time domain unit including ten subframes 103. In the frequency domain, a minimum transmission unit is a subcarrier, and a bandwidth of an overall system transmission band includes $N_{SC}^{BW}$ (105) subcarriers in total. A basic resource unit in the time-frequency domain is a resource element (RE) 106 and may be defined by an OFDM symbol index and a subcarrier index. A resource block (RB) or a physical resource block (PRB) 107 is defined by $N_{symb}$ (101) continuous OFDM symbols in the time domain and $N_{SC}^{RB}$ (108) continuous subcarriers in the frequency domain. Accordingly, one RB 107 includes $N_{symb} \times N_{RB}$ REs 106. In general, a minimum transmission unit of data may be an RB. Generally, in the LTE system, $N_{symb}=7$, $N_{RB}=12$, and $N_{BW}$ and $N_{RB}$ may be proportional to the bandwidth of the system transmission band. However, such specific values may be variably controlled according to systems.

Next, DL control information (DCI) in the LTE or LTE-A system will be described in detail.

According to some embodiments of the disclosure, in the LTE system, scheduling information for DL data or UL data may be transmitted from a base station to a terminal through DCI. According to some embodiments of the disclosure, various formats may be defined for the DCI, and for example, pre-defined DCI formats may be applied according to whether the scheduling information is for UL data or DL data, whether the DCI is a compact DCI having small control information, whether spatial multiplexing using multiple antennas applies, or whether the DCI is for power control. For example, LTE DCI format 1 for scheduling control information for DL data is configured to include at least the following control information.

- Resource allocation type 0/1 flag: notifies whether a resource allocation type is type 0 or type 1. The type 0 involves allocating resources in RB group (RBG) units by applying a bitmap scheme. In the LTE system, a basic unit of scheduling is an RB expressed by time and frequency domain resources, and an RBG includes a plurality of RBs and is used as a basic unit of scheduling in the type 0. The type 1 involves allocating a specific RB in an RBG.
- RB assignment: notifies an RB allocated for data transmission. A resource represented according to a system bandwidth and a resource allocation scheme is determined.
- Modulation and coding scheme (MCS): notifies a modulation scheme used for data transmission and a size of a transport block that is data to be transmitted.
- Hybrid automatic repeat request (HARQ) process number: notifies a process number of an HARQ.
- New data indicator: notifies whether transmission is HARQ initial transmission or re-transmission.
- Redundancy version: notifies a redundancy version of an HARQ.
- Transmit power control (TPC) command for physical uplink control channel (PUCCH): notifies a TPC command for a PUCCH that is a UL control channel.

According to some embodiments of the disclosure, DCI may be transmitted through a physical downlink control channel (PDCCH) through channel coding and modulation.

According to some embodiments of the disclosure, a cyclic redundancy check (CRC) may be attached to payload of a DCI message, and may be scrambled by a radio network temporary identifier (RNTI) corresponding to terminal identity. Different RNTIs may be used according to the purpose of the DCI message, e.g. UE-specific data transmission, power control command, or random access response. Soon, the RNTI is not explicitly transmitted but is transmitted by being included in a CRC computation process. Upon receiving the DCI message transmitted onto the PDCCH, the terminal checks the CRC by using the allocated RNTI, and when a confirmation result of the CRC is correct, the terminal may determine that the DCI message is transmitted to the terminal.

Figure 2:
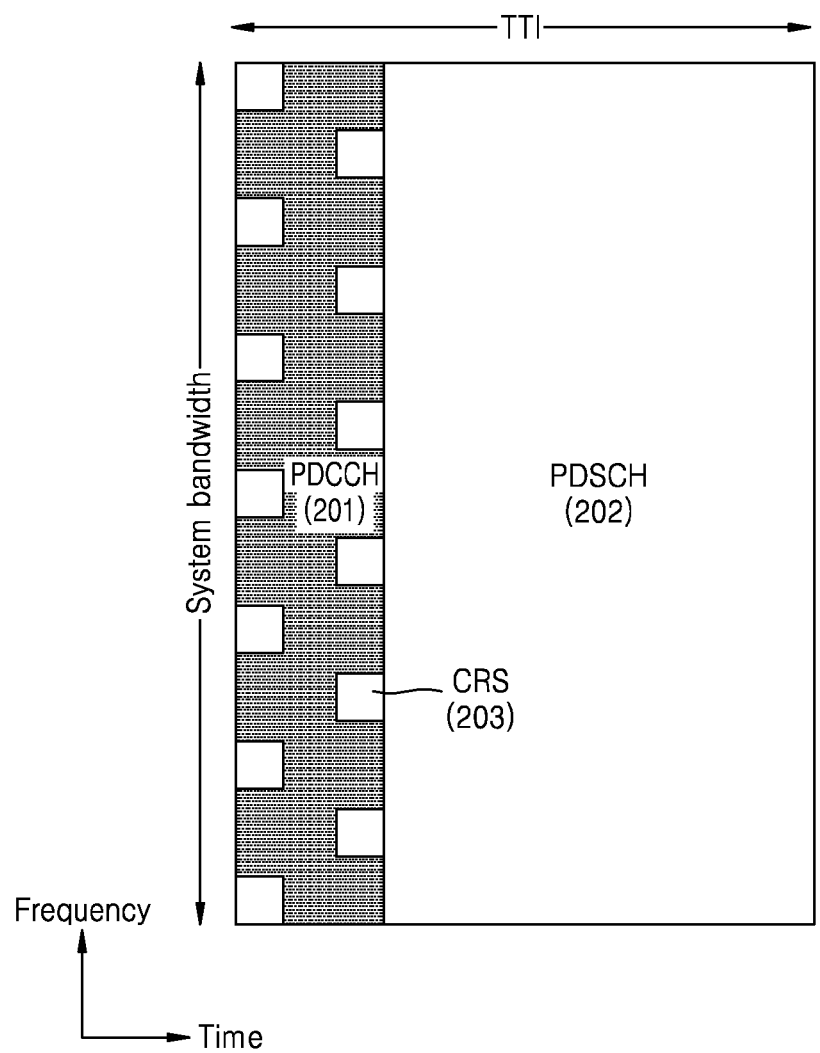
FIG. 2 illustrates a diagram of a downlink (DL) control channel in an LTE system, a 5G system, or the like according to some embodiments of the disclosure.

FIG. 2 illustrates a diagram of a DL control channel in an LTE system, a 5G system, or the like according to some embodiments of the disclosure.

Referring to FIG. 2, a PDCCH 201 through which DCI of LTE is transmitted is illustrated. Referring to FIG. 2, the PDCCH 201 is time-multiplexed with a physical downlink shared channel (PDSCH) 202 that is a data transmission channel, and is transmitted over an overall system bandwidth. A region for the PDCCH 201 is represented with the number of OFDM symbols, which may be indicated to a terminal by a control format indicator (CFI) transmitted through a physical control format indicator channel (PCFICH). The PDCCH 201 may be allocated to the OFDM symbols, which are positioned in the head of a subframe so that the terminal decodes DL scheduling allocation as soon as possible and decoding latency for a DL shared channel (DL-SCH), that is, overall DL transmission latency is reduced. Because one PDCCH may carry one DCI message and multiple terminals may be simultaneously scheduled for a DL and a UL, multiple PDCCHs may be simultaneously transmitted in each cell. A cell-specific reference signal (CRS) 203 is used as a reference signal for decoding the PDCCH 201. The CRS 203 may be transmitted in each subframe over an entire band and scrambling and resource mapping may vary according to cell identity (ID). UE-specific beamforming may not be used because the CRS 203 is a reference signal commonly used by all terminals. Accordingly, a multi-antenna transmission scheme for LTE PDCCH may be limited to open loop transmit diversity. The disclosure is not limited to the above examples. The number of CRS ports is implicitly known to the terminal from the decoding of a physical broadcast channel (PBCH).

According to some embodiments of the disclosure, the resource allocation of the PDCCH 201 may be based on a control-channel element (CCE), and one CCE may include nine resource element groups (REGs), that is, a total of 36 resource elements (REs). The number of CCEs used for the PDCCH 201 may be 1, 2, 4, or 8, and may vary according to a channel coding rate of a DCI message payload. As such, different numbers of CCEs may be used to implement link adaptation of the PDCCH 201. The terminal should detect a signal without knowing information about the PDCCH 201, and LTE defines a search space denoting a set of CCEs for blind decoding. The search space includes a plurality of sets at an aggregation level (AL) of each CCE, which may not be explicitly signaled but implicitly defined by a function and a subframe number by terminal identity. In each subframe, the terminal may decode the PDCCH 201 for all possible resource candidates that may be created from the CCEs in the set search space, and may process information declared through a CRC to be valid for the terminal.

The search space may be classified into a UE-specific search space and a common search space. A predetermined group of terminals or all of the terminals may investigate the common search space of the PDCCH 201 in order to receive cell-common control information such as dynamic scheduling or a paging message for system information. For example, scheduling allocation information of the DL-SCH for transmitting system information block (SIB)-1 including cell service provider information or the like may be received by investigating the common search space of the PDCCH 201.

According to some embodiments of the disclosure, an overall PDCCH region in LTE includes a set of CCEs in a logical region, and there is a search space including a set of CCEs. The search space may be classified into a common search space and a UE-specific search space, and the search space for LTE PDCCH may be defined as follows.

The set of PDCCH candidates to monitor are defined in terms of search spaces, where a search space $S_k^{(L)}$ at aggregation level $L \in \{1,2,4,8\}$ is defined by a set of PDCCH candidates. For each serving cell on which PDCCH is monitored, the CCEs corresponding to PDCCH candidate m of the search space $S_k^{(L)}$ are given by
$$L \{(Y_k + m') \bmod \lfloor N_{CCE,k}/L \rfloor\} + i$$
where $Y_k$ is defined below, $i = 0, \ldots, L - 1$. For the common search space $m' = m$. For the PDCCH UE specific search space, for the serving cell on which PDCCH is monitored, if the monitoring UE is configured with carrier indicator field then $m' = m + M^{(L)} \cdot n_{cl}$ where $n_{cl}$ is the carrier indicator field value, else if the monitoring UE is not configured with carrier indicator field then $m' = m$, where $m = 0, \ldots, M^{(L)} - 1$. $M^{(L)}$ is the number of PDCCH candidates to monitor in the given search space.
Note that the carrier indicator field value is the same as ServCellIndex
For the common search spaces, $Y_k$ is set to 0 for the two aggregation levels $L = 4$ and $L = 8$.
For the UE-specific search space $S_k^{(L)}$ at aggregation level L, the variable $Y_k$ is defined by
$$Y_k = (A \cdot Y_{k-1}) \bmod D$$
where $Y_{-1} = n_{RNTI} \neq 0$, $A = 39827$, $D = 65537$ and $k = \lfloor n_s/2 \rfloor$, $n_s$ is the slot number within a radio frame.
The RNTI value used for $n_{RNTI}$ is defined in subclause 7.1 in downlink and subclause 8 in uplink.

According to the definition of the search space for PDCCH, the UE-specific search space may not be explicitly signaled but implicitly defined through a function and a subframe number by terminal identity. In other words, because the UE-specific search space may vary according to the subframe number, the UE-specific search space may vary according to time, and thus, a blocking problem in which a particular terminal among terminals may not use the search space due to the other terminals may be solved. When a certain terminal may not be scheduled in a subframe because all CCEs which the certain terminal investigates are already used by other terminals scheduled in the same subframe, such a problem may not occur in a next subframe because the search space varies over time. For example, although UE-specific search spaces of terminal #1 and terminal #2 partially overlap in a particular subframe, the overlap may be expected to be different from that in a next subframe because the UE-specific search spaces vary according to subframes.

According to some embodiments of the disclosure, according to the definition of the search space for PDCCH, the common search space is defined as a set of CCEs that are previously agreed on because a predetermined group of terminals or all of the terminals should receive a PDCCH. In other words, the common search space may not vary according to e.g., terminal identity or a subframe number. Although the common search space exists for transmission of various system messages, the common search space may be used to transmit control information for individual terminals. Accordingly, the common search space may be used to address the terminal's failure to be scheduled due to insufficient available resources in the UE-specific search space.

According to some embodiments of the disclosure, the search space is a set of candidate control channels including CCEs which the terminal has to attempt to decode at a given aggregation level, and because there are several aggregation levels for bundling up 1, 2, 4, or 8 CCEs, the terminal may have a plurality of search spaces. The number of PDCCH candidates that the terminal needs to monitor in the search space defined according to the aggregation level in the LTE PDCCH may be defined as shown in the following table.

TABLE 1

| Type | Search space $S_k^{(L)}$ Aggregation level L | Size [in CCEs] | Number of PDCCH candidates $M^{(L)}$ |
|---|---|---|---|
| UE-specific | 1 | 6 | 6 |
|  | 2 | 12 | 6 |
|  | 4 | 8 | 2 |
|  | 8 | 16 | 2 |

TABLE 1-continued

| Type | Search space $S_k^{(L)}$ Aggregation level L | Size [in CCEs] | Number of PDCCH candidates $M^{(L)}$ |
|---|---|---|---|
| Common | 4 | 16 | 4 |
|  | 8 | 16 | 2 |

According to Table 1, the UE-specific search space may support aggregation levels $\{1, 2, 4, 8\}$, and may have $\{6, 6, 2, 2\}$ PDCCH candidates. A common search space may support aggregation levels $\{4, 8\}$, and may have $\{4, 2\}$ PDCCH candidates. The common search space only needs to support the aggregation levels $\{4, 8\}$ in order to have good coverage characteristics because a system message is generally used to reach a cell edge.

According to some embodiments of the disclosure, DCI transmitted to the common search space may be defined only for particular DCI formats such as 0/1A/3/3A/1C which are ones for power control purpose for a terminal group or a system message. The common search space does not support a DCI format having spatial multiplexing. A DL DCI format that has to be decoded in the UE-specific search space varies according to a transmission mode set for the terminal. Because the transmission mode is set through radio resource control (RRC) signaling, an exact subframe number as to whether the setting is effective for the terminal may not be designated. The disclosure is not limited to the above embodiments of the disclosure. Accordingly, the terminal may operate not to lose communication by always performing decoding on DCI format 1A regardless of the transmission mode.

In the above, a method of transmitting/receiving a DL control channel and DCI and a search space in LTE and LTE-A have been described, and a DL control channel in a 5G communication system which is currently discussed will be described below in more detail with reference to the drawings.

Figure 3:
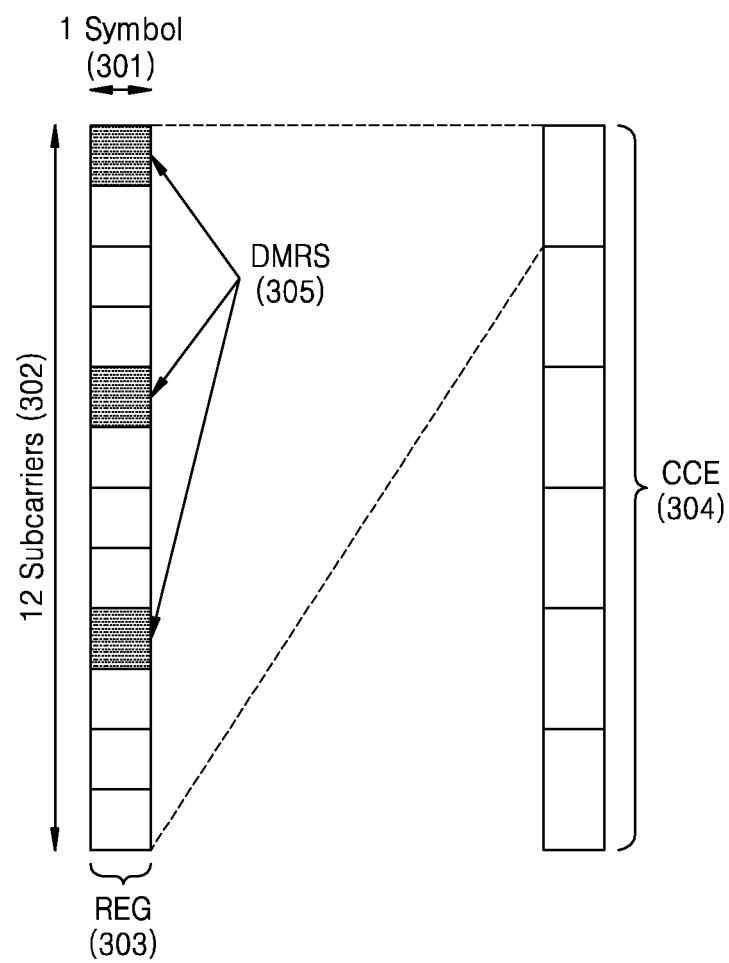
FIG. 3 illustrates a diagram of a transmission resource of a DL control channel in an LTE system, a 5G system, or the like according to some embodiments of the disclosure.

FIG. 3 illustrates a diagram of a transmission resource of a DL control channel in an LTE system, a 5G system, or the like according to some embodiments of the disclosure.

Referring to FIG. 3, a basic unit (e.g., an REG) of a time-and-frequency resource constituting a control channel includes one OFDM symbol 301 along the time axis, and 12 subcarriers 302, that is, one RB, along the frequency axis. By assuming that one OFDM symbol 301 is a basic unit on the time axis in constituting the basic unit of the control channel, a data channel and a control channel may be time-multiplexed in one subframe. By locating the control channel ahead of the data channel, a user's processing time may be reduced and a latency requirement may be easily satisfied. By setting the basic unit on the frequency axis for the control channel to one RB (i.e., the subcarriers 302), frequency multiplexing between the control channel and the data channel may be more efficiently performed.

Control channel regions of various sizes may be set by joining REGs 303 of FIG. 3. As an example, when the basic unit in which the DL control channel is allocated in 5G is a CCE 304, one CCE 304 may include multiple REGs 303. For example, when the REG 303 of FIG. 3 includes 12 REs and one CCE 304 includes 6 REGs 303, the CCE 304 may include 72 REs. When the DL control region is set, the DL control region may include multiple CCEs 304, and a particular DL control channel may be mapped to one or more CCEs 304 according to an AL in the control region and may be transmitted. The CCEs 304 in the control region may be distinguished with numbers and the numbers may be assigned according to a logical mapping scheme.

The basic unit, i.e., the REG 303, of the DL control channel of FIG. 3 may contain REs to which DCI is mapped and a region to which a DMRS 305, a reference signal for decoding the REs, is mapped. As shown in FIG. 3, the DMRS 305 may be transmitted in three REs in one REG 303. For reference, because the DMRS is transmitted by using the same precoding as a control signal mapped in the REG 303, a terminal may decode control information without information about which precoding is applied by a base station.

Figure 4:
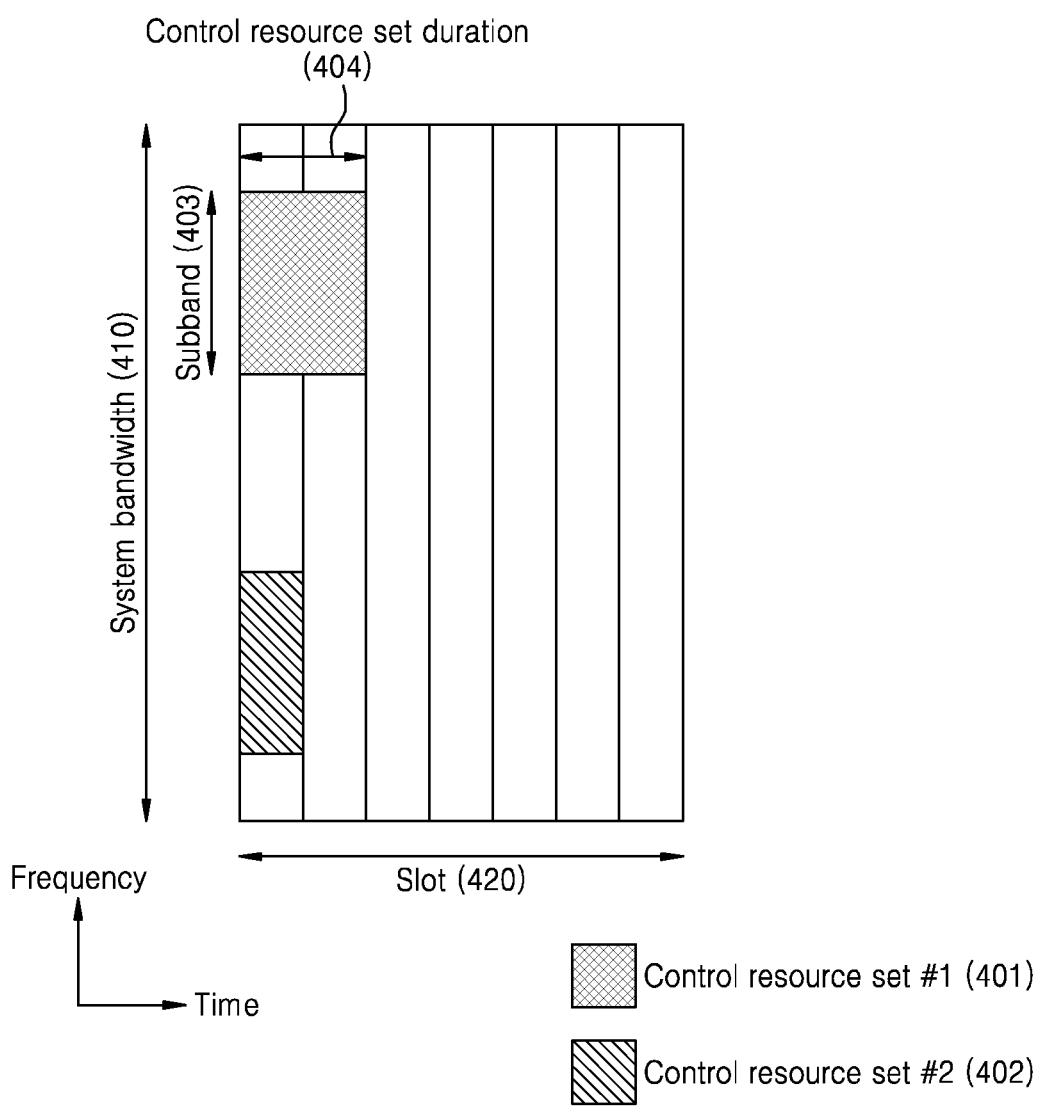
FIG. 4 illustrates a diagram of a configuration of a control region in an LTE system, a 5G system, or the like according to some embodiments of the disclosure.

FIG. 4 illustrates a diagram of a configuration of a control region in an LTE system, a 5G system, or the like according to some embodiments of the disclosure.

Referring to FIG. 4, as a control region (e.g., a control resource set (CORESET)) where a DL control channel is transmitted in a 5G wireless communication system, two control regions (i.e., control resource set #1 401 and control resource set #2 402) are set in one slot 420 on the time axis (assuming that one slot includes seven OFDM symbols in FIG. 4) and a system bandwidth 410 on the frequency axis. The control resource set #1 401 and control resource set #2 402 may be set to a particular subband 403 in the system bandwidth 410 overall on the frequency axis. One or more OFDM symbols may be set on the time axis, which may be defined as a control resource set duration 404. In FIG. 4, the control resource set #1 401 is set to a two-symbol control resource set duration, and the control resource set #2 402 is set to a one-symbol control resource set duration.

The control region in 5G may be set via higher layer signaling (e.g., system information, master information block (MIB), or RRC signaling) from a base station to a terminal. When the control region is set to the terminal, it may mean that information such as a location of the control region, a subband, resource allocation of the control region, and a control resource set duration is provided. For example, the information may contain information of Table 2 below.

TABLE 2 configuration information 1. frequency-axis RB allocation

TABLE 2-continued information configuration information 2. control region start symbol configuration information 3. control resource set duration configuration information 4. REG bundling size (2, 3, or 6)

configuration information 5. transmission mode (interleaved transmission scheme or non-interleaved transmission scheme)

configuration information 6. DMRS configuration information (precoder granularity)

configuration information 7. search space type (common search space, group-common search space, or UE-specific search space)

configuration information 8. DCI format to be monitored in corresponding control region others The disclosure is not limited to the above examples, and various pieces of information necessary to transmit a DL control channel in addition to the above configuration information may be set to the terminal.

Next, DCI in 5G will be described in detail.

In a 5G system, scheduling information for UL data (e.g., a physical uplink shared channel (PUSCH)) or DL data (e.g., a PDSCH) may be transmitted through DCI from a base station to a terminal. The terminal may monitor a fallback DCI format and a non-fallback DCI format for a PUSCH or a PDSCH. The fallback DCI format may include a field fixed between the base station and the terminal, and the non-fallback DCI format may include a configurable field.

According to some embodiments of the disclosure, fallback DCI for scheduling the PUSCH may include information of Table 3.

TABLE 3

Identifier for DCI formats-[1] bit

Frequency domain resource assignment-[$\lceil \log_2(N_{RB}^{UL,BWP} (N_{RB}^{UL,BWP} + 1)/2) \rceil$] bits Time domain resource assignment-X bits Frequency hopping flag-1 bit.

Modulation and coding scheme-[5] bits

New data indicator-1 bit

Redundancy version-[2] bits

HARQ process number-[4] bits

TPC command for scheduled PUSCH-[2] bits

UL/SUL indicator-0 or 1 bit

According to some embodiments of the disclosure, non-fallback DCI for scheduling the PUSCH may include information of Table 4.

TABLE 4

Carrier indicator - 0 or 3 bits identifier for DCI formats - [1] bits

Bandwidth part indicator - 0, 1 or 2 bits

Frequency domain resource assignment

For resource allocation type 0, $\lceil N_{RB}^{UL,BWP}/P \rceil$ bits

For resource allocation type 1, $\lceil \log_2 (N_{RB}^{UL,BWP}(N_{RB}^{UL,BWP} + 1)/2) \rceil$ bits TABLE 4-continued Time domain resource assignment -1, 2, 3, or 4 bits
VRB-to-PRB mapping - 0 or 1 bit, only for resource allocation type 1.
  0 bit if only resource allocation type 0 is configured;
  1 bit otherwise.
Frequency hopping flag - 0 or 1 bit, only for resource allocation type 1.
  0 bit if only resource allocation type 0 is configured;
  1 bit otherwise.
Modulation and coding scheme - 5 bits
New data indicator - 1 bit
Redundancy version - 2 bits as defined in section x.x of [6, TS38.214]
HARQ process number - 4 bits
1st downlink assignment index - 1 or 2 bits
  1 bit for semi-static HARQ-ACK codebook;
  2 bits for dynamic HARQ-ACK codebook with single HARQ-ACK codebook.
2nd downlink assignment index - 0 or 2 bits
  2 bits for dynamic HARQ-ACK codebook with two HARQ-ACK
  sub-codebooks;
  0 bit otherwise.
TPC command for scheduled PUSCH - 2 bits SRS resource indicator $- \left\lceil \log_2\left(\sum_{k=1}^{L_{max}} \binom{N_{SRS}}{k}\right) \right\rceil$ or $\lceil \log_2(N_{SRS}) \rceil$ bits $\left\lceil \log_2\left(\sum_{k=1}^{L_{max}} \binom{N_{SRS}}{k}\right) \right\rceil$ bits for non-codebook based PUSCH transmission;

$\lceil \log_2(N_{SRS}) \rceil$ bits for codebook based PUSCH transmission.
Precoding information and number of layers -up to 6 bits
Antenna ports - up to 5 bits
SRS request - 2 bits
CSI request - 0, 1, 2, 3, 4, 5, or 6 bits
CBG transmission information - 0, 2, 4, 6, or 8 bits
PTRS-DMRS association - 2 bits.
beta_offset indicator - 2 bits
DMRS sequence initialization - 0 or 1 bit
UL/SUL indicator - 0 or 1 bit According to some embodiments of the disclosure, the fallback DCI for scheduling the PDSCH may include information of Table 5.

TABLE 5

Identifier for DCI formats-[1] bit
Frequency domain resource assignment-[$\lceil \log_2(N_{RB}^{DL,BWP} (N_{RB}^{DL,BWP} + 1)/2) \rceil$] bits
Time domain resource assignment-X bits
VRB-to-PRB mapping-1 bit.
Modulation and coding scheme-[5] bits
New data indicator-1 bit
Redundancy version-[2] bits
HARQ process number-[4] bits
Downlink assignment index-2 bits
TPC command for scheduled PUCCH-[2] bits
PUCCH resource indicator-[2] bits
PDSCH-to-HARQ feedback timing indicator-[3] bits According to some embodiments of the disclosure, the non-fallback DCI for scheduling the PDSCH may include information of Table 6.

TABLE 6

Carder indicator-0 or 3 bits
Identifier for DCI formats-[1] bits
Bandwidth part indicator-0, 1 or 2 bits
Frequency domain resource assignment
For resource allocation type 0, $\lceil N_{RB}^{DL,BWP}/P \rceil$ bits
For resource allocation type 1, $\lceil \log_2(N_{RB}^{DL,BWP} (N_{RB}^{DL,BWP} + 1)/2) \rceil$ bits
Time domain resource assignment-1, 2, 3, or 4 bits
VRB-to-PRB mapping-0 or 1 bit, only for resource allocation type 1.

TABLE 6-continued 0 bit if only resource allocation type 0 is configured;
  1 bit otherwise.
PRB bundling size indicator-1 bit
Rate matching indicator-0, 1, 2 bits
ZP CSI-RS trigger-X bits
For transport block 1:
Modulation and coding scheme-5 bits
New data indicator-1 bit
Redundancy version- 2 bits
For transport block 2:
Modulation and coding scheme-5 bits
New data indicator-1 bit
Redundancy version- 2 bits
HARQ process number-4 bits
Downlink assignment index-0 or 4 bits
TPC command for scheduled PUCCH-2 bits
PUCCH resource indicator
PDSCH-to-HARQ_feedback timing indicator-3 bits
Antenna ports-up to 5 bits
Transmission configuration indication-3 bits
SRS request-2 bits
CBG transmission information-0, 2, 4, 6, or 8 bits
CBG flushing out information-0 or 1 bit
DMRS sequence initialization-0 or 1 bit According to some embodiments of the disclosure, DCI may be transmitted through a PDCCH through channel coding and modulation. According to some embodiments of the disclosure, a CRC may be attached to payload of a DCI message and may be scrambled by an RNTI corresponding to terminal identity. Different RNTIs may be used according to the purpose of the DCI message, e.g. UE-specific data transmission, power control command, or random access response. Also, according to some embodiments of the disclosure, the RNTI is not explicitly transmitted but is transmitted by being included in a CRC computation process. Upon receiving the DCI message transmitted onto the PDCCH, the terminal checks the CRC using the allocated RNTI, and when a confirmation result of the CRC is correct, the terminal may determine that the DCI message is transmitted to the terminal.

For example, DCI for scheduling a PDSCH for system information (SI) may be scrambled by an SI-RNTI. DCI for scheduling a PDSCH for a random access response (PAR) message may be scrambled by an RA-RNTI. DCI for scheduling a PDSCH for a paging message may be scrambled by a P-RNTI. DCI for notifying a slot format indicator (SFI) may be scrambled by an SFI-RNTI. DCI for notifying a transmit power control (TPC) may be scrambled by a TPC-RNTI. DCI for scheduling a UE-specific PDSCH or PUSCH may be scrambled by a cell RNTI (C-RNTI).

Figure 5:
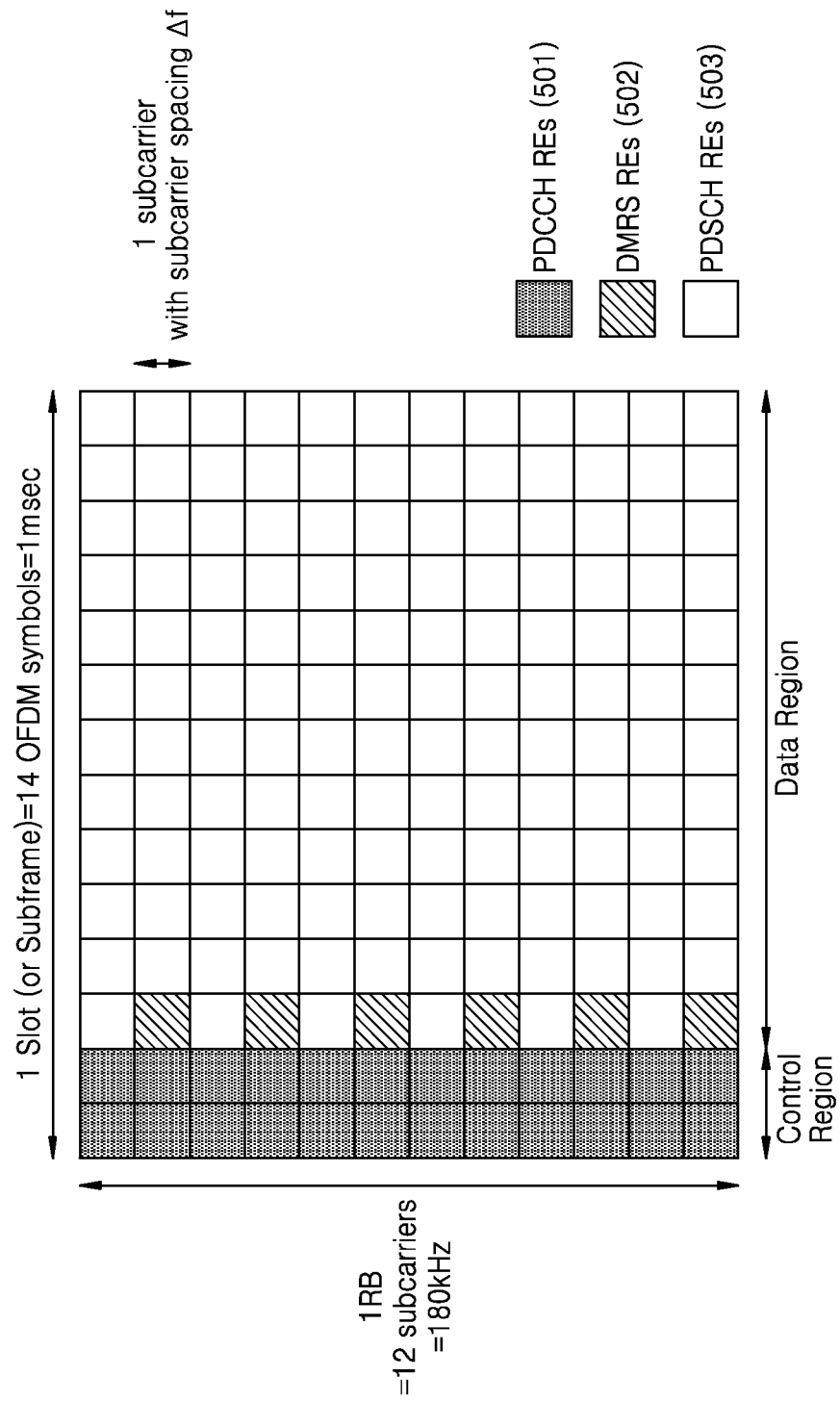
FIG. 5 illustrates a diagram of a configuration of a DL resource block (RB) structure in an LTE system, a 5G system, or the like according to some embodiments of the disclosure.

According to some embodiments of the disclosure, when a data channel, that is, a PUSCH or a PDSCH, is scheduled to a particular terminal through a PDCCH, data in a scheduled resource region may be transmitted/received along with a DMRS. In FIG. 5, in a DL, a particular terminal uses 14 OFDM symbols as one slot (or subframe), and is configured so that a PDCCH is transmitted in initial two OFDM symbols and a DMRS is transmitted in a third symbol. In FIG. 5, a PDSCH in a specific RB to which the PDSCH is scheduled is transmitted so that data is mapped to REs where the DRMS is not transmitted in the third symbol and REs in a fourth symbol to a last symbol. A subcarrier spacing $\Delta f$ of FIG. 5 may be 15 kHz in the LTE/LTE-A system, and may be one of $\{15, 30, 60, 120, 240, 480\}$ kHz in the 5G system.

Also, according to some embodiments of the disclosure, in a cellular system, a base station has to transmit a reference signal in order to measure a DL channel state. In a 3GPP LTE-A system, a terminal may measure a channel state between the base station and the terminal by using a CRS or a channel state information reference signal (CSI-RS) transmitted from the base station. The channel state has to be measured considering several factors, and may include the amount of interference in a DL. The amount of interference in the DL may include an interference signal and thermal noise generated by antennas belonging to the adjacent base station, and is important in order for the terminal to determine a channel condition of the DL. According to some embodiments of the disclosure, when the base station having one transmission antenna transmits a signal to the terminal having one reception antenna, the terminal should determine energy per symbol that may be received in the DL and the amount of interference to be simultaneously received in a section where the corresponding symbol is received by using the reference signal received from the base station, and should determine an energy per symbol to interference density ratio (Es/Io). The determined Es/Io may be converted into a data transmission speed or a value corresponding to the data transmission speed, and may be transmitted to the base station in the form of a channel quality indicator (CQI) value to enable the base station to determine at what data transmission speed the base station is to perform data transmission to the terminal.

According to some embodiments of the disclosure, in the LTE system, the LTE-A system, the 5G system, or the like, the terminal may feed information about the channel state of the DL to the base station so that the information is used for DL scheduling of the base station. That is, the terminal measures the reference signal transmitted by the base station in the DL and feeds information extracted from the reference signal back to the base station in the form defined in the LTE and LTE-A standards. The information which the terminal feeds back in LTE-LTE-A may be referred to as channel state information, and the channel state information may include the following three pieces of information.

Rank indicator (RI): the number of spatial layers that may be received by the terminal in a current channel state.

Precoding matrix indicator (PMI): an indicator of a precoding matrix preferred by the terminal in the current channel state.

CQI: a maximum data rate at which the terminal may receive data in the current channel state.

According to some embodiments of the disclosure, the CQI may be replaced by a signal to interference plus noise ratio (SINR) that may be used similarly to the maximum data rate, a maximum error correction code rate and modulation method, and data efficiency per frequency.

According to some embodiment of the disclosure, the RI, PMI, and CQI have meanings in association with one another. For example, a precoding matrix supported in LTE/LTE-A is differently defined per rank. For example, a PMI value X when the RI has a value of 1 and the PMI value X when the RI has a value of 2 may be differently interpreted. Also, it is assumed that the PMI value X reported by the terminal to the base station is applied to the base station even when the terminal determines the CQI. That is, when the RI is RI_X and the PMI is PMI_Y in the case where the terminal reports RI_X, PMI_Y, and CQI_Z to the base station, it may mean that the terminal may receive a data rate corresponding to the CQI_Z. As such, the terminal may assume in what transmission method the terminal performs transmission to the base station when calculating the CQI, and may obtain an optimum performance when performing actual transmission in the corresponding transmission method.

According to some embodiments of the disclosure, the RI, PMI, and CQI that are the channel state information fed back by the terminal in LTE/LTE-A may be fed back periodically or non-periodically. When the base station is to non-periodically obtain the channel state information of the particular terminal, the base station may be set to perform aperiodic feedback (or aperiodic channel state information report) by using an aperiodic feedback indicator (or channel state information request field, channel state information request information) included in DCI for the terminal. Also, when the terminal receives the indicator set to perform the aperiodic feedback in an $n^{th}$ subframe, the terminal may perform UL transmission by including aperiodic feedback information (or channel state information) in data transmission in an $(n+k)^{th}$ subframe. Here, k that is a parameter defined in the 3GPP LTE Release 11 standard may be 4 in frequency division duplexing (FDD), and may be defined as shown in Table 7 in time division duplexing (TDD).

TABLE 7 k value for each subframe number n in TDD UL/DL configuration

| TDD UL/DL Configuration | subframe number n | | | | | | | | | |
|---|---|---|---|---|---|---|---|---|---|---|
| | 0 | 1 | 2 | 3 | 4 | 5 | 6 | 7 | 8 | 9 |
| 0 | — | — | 6 | 7 | 4 | — | — | 6 | 7 | 4 |
| 1 | — | — | 6 | 4 | — | — | — | 6 | 4 | — |
| 2 | — | — | 4 | — | — | — | — | 4 | — | — |
| 3 | — | — | 4 | 4 | 4 | — | — | — | — | — |
| 4 | — | — | 4 | 4 | — | — | — | — | — | — |
| 5 | — | — | 4 | — | — | — | — | — | — | — |
| 6 | — | — | 7 | 7 | 5 | — | — | 7 | 7 | — |

Also, according to some embodiments of the disclosure, when the aperiodic feedback is set, feedback information (or the channel state information) may include the RI, PMI, and CQI, and the RI and PMI may not be fed back according to feedback configuration (or channel state report configuration).

Figure 6:
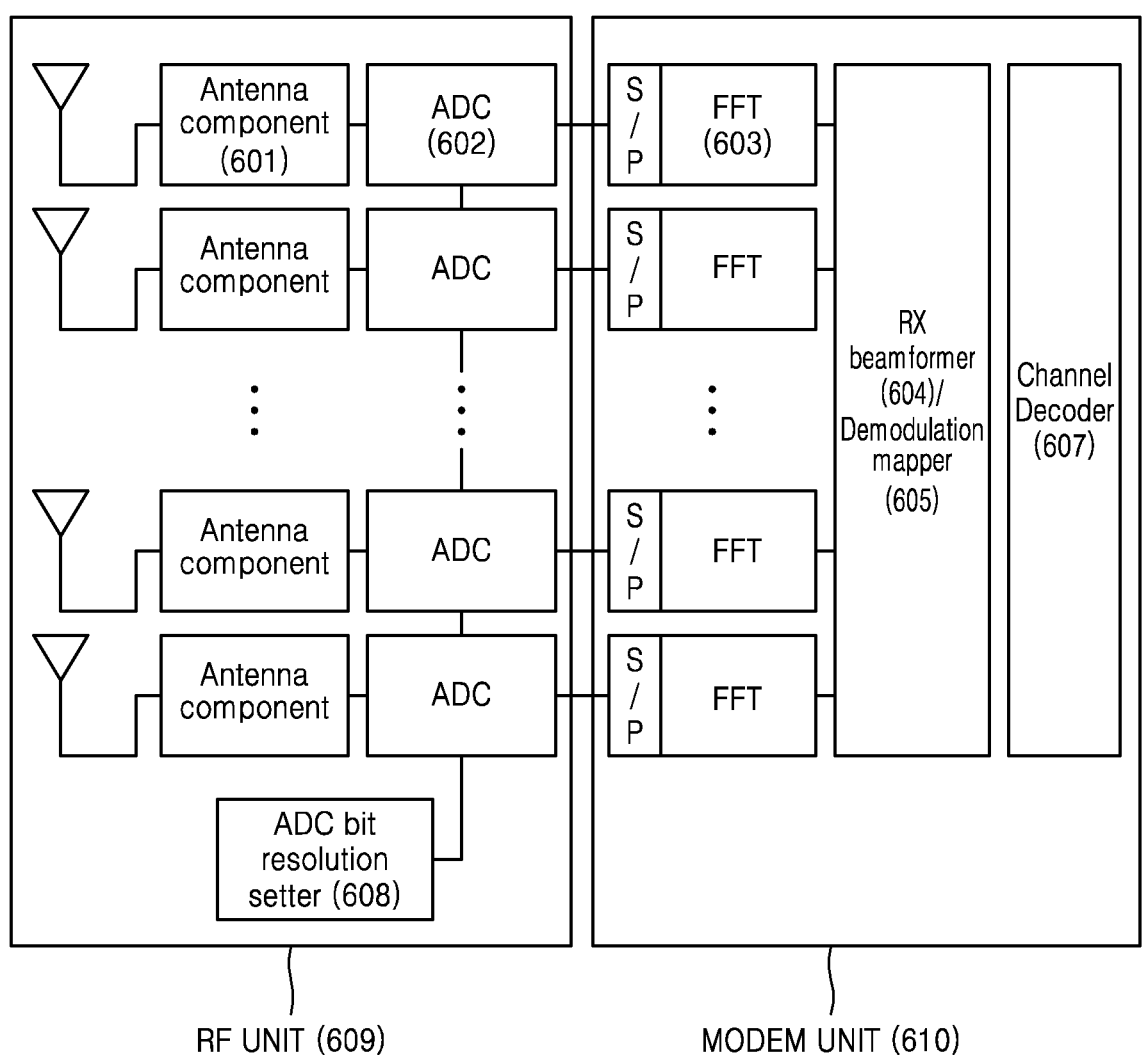
FIG. 6 illustrates a block diagram of a structure of a receiver of a terminal according to some embodiments of the disclosure.

FIG. 6 illustrates a block diagram of a structure of a receiver of a terminal according to some embodiments of the disclosure.

Referring to FIG. 6, the receiver of the terminal may include a radio frequency (RF) unit 609 and a modem unit 610. The RF unit 609 may include an antenna component 601, an analog-to-digital converter (ADC) 602, and an ADC bit resolution setter 608. The modem unit 610 may include a fast Fourier transformer (FFT) 603, a receive beamformer 604, a demodulation mapper 605, and a channel decoder 507. The structure of the receiver of the terminal of FIG. 6 is a structure of a receiver of a general terminal including multiple antennas, and each element may be replaced by another element having a similar function.

The amount of power $P_{ADC}$ consumed by the ADC 602 of the RF unit 609 may be defined by Equation 1. In Equation 1, $P_{comparison}$ denotes a power consumed by the ADC 602 to compare an analog signal once to output a digital output, and Sampling rate denotes a value corresponding to a reciprocal of a given bandwidth. In Equation 1, when ADC bit resolution that denotes a bit resolution value output by the ADC 602 is, for example, 2, an output value of the ADC 602 may be one of four values corresponding to 00, 01, 10, and 11.

$$P_{ADC} = P_{comparision} \times \text{Sampling rate} \times 2^{ADC\ bit\ resolution} \times \text{\# of Antennas} \quad \text{Equation 1}$$

It is found from Equation 1 that as a bit resolution of the ADC 602 decreases, the amount of power consumed by the ADC 602 is decreases in proportion to an exponent of 2.

When the bit resolution of the ADC 602 decreases, quantization noise may increase. The quantization noise that is a difference between an actual input value X of the ADC 602 and an output value Y corresponding to the actual input value X is interference occurring when an analog signal is converted into a digital signal. In this case, a signal-to-quantization noise ratio (SQNR) corresponding to the ADC bit resolution may be as shown in Table 8.

TABLE 8

SQNR corresponding to ADC bit resolution

| ADC bit resolution | 1-bit | 2-bit | 3-bit | 4-bit | 5-bit | 6-bit | 7-bit | 8-bit |
|---|---|---|---|---|---|---|---|---|
| QSNR(dB) | 4.40 | 9.25 | 14.3 | 19.3 | 24.6 | 29.8 | 35.1 | 40.6 |

Embodiments of the disclosure will be described in detail with reference to the attached drawings. Also, although an LTE or LTE-A system is described in embodiments of the disclosure, the embodiments of the disclosure may also be applied to other communication systems having a similar technical background or channel type. For example, the embodiments of the disclosure may be applied to 5G mobile communication technology (e.g., 5G NR) developed after LTE-A. Accordingly, it will be understood by one of ordinary skill in the art that the embodiments of the disclosure may be applied to other communication systems through some modifications without departing from the scope of the disclosure.

Also, in describing the disclosure, related well-known functions or configurations incorporated herein are not described in detail in the case where it is determined that they obscure the subject matter of the disclosure in unnecessary detail. The following terms are defined in consideration of functions in the disclosure, and may vary according to the intention of users or operators, precedents, etc. Accordingly, the specific terms used herein should be understood based on the whole context of the disclosure.

The disclosure provides a method of reducing energy consumed by a receiving terminal by adjusting a bit resolution of an ADC. Hereinafter, the method of reducing energy consumed by the receiving terminal by adjusting the bit resolution of the ADC is referred to as an energy saving operation. Also, the disclosure provides a method of limiting a CQI value and an MCS value as a method for minimizing the effect of quantization noise caused by a decrease in the bit resolution of the ADC.

The disclosure may include an operation in which a terminal adjusts a bit resolution of an ADC, an ADC structure capable of adjusting a bit resolution, a process in which the terminal determines an energy saving operation, a process in which the terminal reports the energy saving operation to a base station, a process of measuring a parameter related to energy consumption of the terminal, and a process of reporting the parameter related to the energy consumption of the terminal to the base station.

Energy saving operation-related information reported by the terminal to the base station may include information about the bit resolution of the ADC of the terminal, a maximum MCS value of the terminal according to ADC configuration, and a maximum CQI value. In this case, the parameter related to the energy consumption of the terminal measured by the terminal and reported to the base station may be a parameter directly or indirectly related to the energy saving operation of the terminal. According to some embodiments of the disclosure, the parameter related to the energy saving operation of the terminal may include remaining energy of the terminal, a determination of the terminal to enter an energy saving mode, an ADC bit resolution range of the terminal, a noise level suffered by the terminal, and a maximum MCS value settable by the base station according to the bit resolution of the ADC of the terminal and a maximum CQI value corresponding to the maximum MCS value. The parameter related to the energy consumption of the terminal and the energy saving operation-related information may include only some of the above items according to purposes.

Also, the disclosure may include a process in which the base station enters the energy saving operation according to a request of the terminal and transmits data, a process in which the base station receives the parameter related to the energy saving operation of the terminal and causes the terminal to enter the energy saving operation, and a process in which the base station transmits data to the terminal in the energy saving operation.

Also, the disclosure may include a process of limiting the maximum MCS value settable by the base station and the maximum CQI value according to the bit resolution of the ADC of the terminal. In this case, the maximum MCS value corresponding to an SQNR obtainable by the terminal after the bit resolution of the terminal is adjusted may be defined as follows.

When the bit resolution of the terminal is determined to be a specific value, an MCS value right below an MCS value whose transmission error (e.g., transmission error) when the terminal receives a signal or data from the base station is equal to or greater than a specific error rate may be defined as the maximum MCS value. Also, when the bit resolution of the terminal is determined to be a specific value, a maximum MCS value of the terminal which may be used by the base station so that a transmission error when the terminal receives a signal or data from the base station is equal to a specific error rate may be defined as the maximum MCS value. Also, a value corresponding to the maximum MCS value may be defined as the maximum CQI value.

In this case, the maximum MCS value and the maximum CQI value of the terminal may vary according to hardware capability of the terminal, and may be shared through information exchange with the base station. However, when information about the maximum MCS value and the maximum CQI value is not shared, MCS and CQI values of Table 9 calculated from Table 8 may be used. The MCS and CQI values are values corresponding to MCS Tables 5.1.3.1-2 and 5.2.2.1-3 of 3GPP TS 38.214, and Table 9 shows an example assuming that the terminal supports 256 quadrature amplitude modulation (QAM) and when the terminal only supports up to 64 QAM, the MCS and CQI values may be re-designed based on MCS Table 5.1.3.1-1 and CQI Table 5.2.2.1-2.

TABLE 9

Basic maximum MCS and CQI values according to the ADC bit resolution of the terminal

| ADC bit resolution | 1-bit | 2-bit | 3-bit | 4-bit | 5-bit | 6-bit | 7-bit | 8-bit |
|---|---|---|---|---|---|---|---|---|
| QSNR(dB) | 4.4 | 9.25 | 14.3 | 19.3 | 24.6 | 29.8 | 35.1 | 40.6 |
| Maximum MCS | 4 | 10 | 14 | 17 | 23 | 26 | 28 | 28 |
| Maximum CQI | 3 | 6 | 8 | 10 | 12 | 14 | 15 | 15 |

In this case, according to the disclosure, because the terminal and the base station operate by limiting the maximum MCS and CQI values according to the bit resolution of the terminal, a channel intensity between the base station and the terminal, and a noise level, energy consumption of the terminal may be reduced and data may be efficiently transmitted/received between the terminal and the base station.

Figure 7:
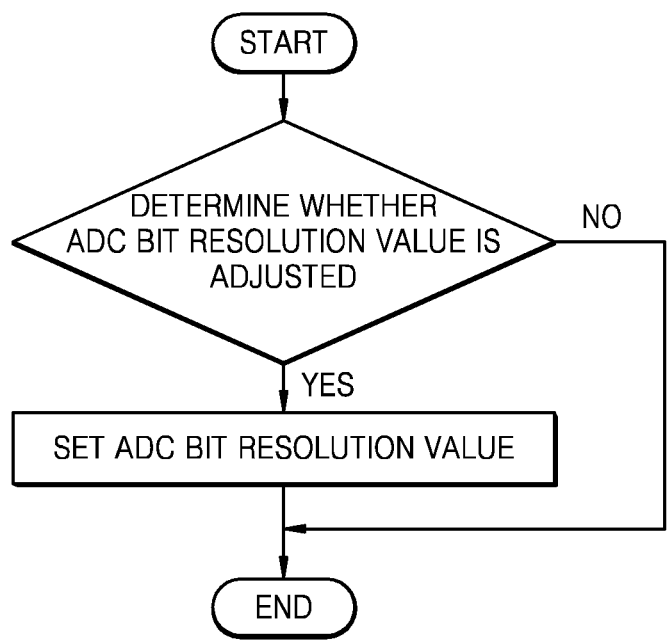
FIG. 7 illustrates a flowchart of an operation in which a terminal adjusts an analog-to-digital converter (ADC) bit resolution according to some embodiments of the disclosure.

FIG. 7 illustrates a flowchart of an operation in which a terminal adjusts an ADC bit resolution according to some embodiments of the disclosure.

According to some embodiments of the disclosure, an ADC bit resolution of a terminal may be set by an ADC bit resolution setter of the terminal. The ADC bit resolution setter may perform an ADC bit resolution adjusting operation according to a change in a parameter related to energy consumption of the terminal, and a determination of a base station or a determination of the terminal.

The parameter related to the energy consumption of the terminal may correspond to the parameter related to the energy consumption of the terminal which the terminal reports to the base station in relation to an energy saving operation. In this case, the ADC bit resolution adjusting operation according to the change in the parameter of the terminal may be performed when an energy saving operation-related parameter of the terminal is less than a pre-set threshold value. Also, the determination of the terminal may refer to an energy saving operation-related determination at a higher layer of the terminal. Also, the determination of the base station may refer to a determination of the base station to set the terminal to an energy saving mode by using the energy saving operation-related parameter reported from the terminal.

According to some embodiments of the disclosure, the terminal may become a subject which determines whether to perform the energy saving operation and may perform the energy saving operation by itself.

Figure 8:
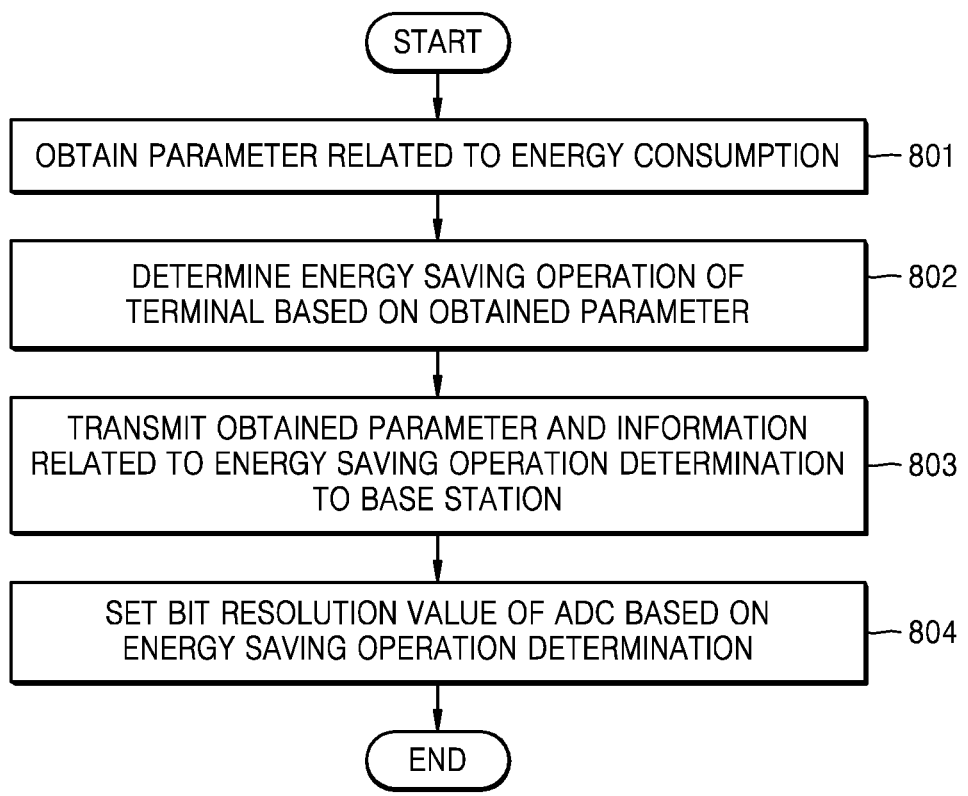
FIG. 8 illustrates a flowchart of an energy saving operation performed by a terminal according to a determination of the terminal according to some embodiments of the disclosure.

FIG. 8 illustrates a flowchart of an energy saving operation performed by a terminal according to a determination of the terminal according to some embodiments of the disclosure.

In operation 801, a terminal may obtain a parameter related to energy consumption.

According to some embodiments of the disclosure, the parameter related to the energy consumption of the terminal may be a parameter directly or indirectly related to an energy saving operation of the terminal. The parameter related to the energy consumption of the terminal may include a value measured by the terminal from the outside, for example, a channel intensity between the current terminal and a base station, the intensity or amount of interference with a signal received from the base station, and thermal noise of the signal received from the base station. Also, the parameter related to the energy consumption of the terminal may include a value measured inside the terminal, for example, an energy consumption amount of the terminal and a residual energy amount of the terminal. Also, the parameter related to the energy consumption of the terminal may include a value related to hardware of the terminal, for example, an ADC bit resolution range of the terminal, a bit resolution range settable by an ADC of the terminal, an SQNR value according to an ADC bit resolution value of the terminal, and a maximum CQI value and a maximum MCS value limited by setting a bit resolution value. A determination as to the energy saving operation of the terminal at a higher layer of the terminal may also be included in the parameter related to the energy consumption of the terminal.

In operation 802, the terminal may determine the energy saving operation based on the obtained parameter.

According to some embodiments of the disclosure, the terminal may determine the energy saving operation by comparing the obtained parameter with a threshold value that is pre-set by the terminal. For example, the terminal may determine to perform the energy saving operation when the obtained parameter is less than the pre-set threshold value. According to another embodiment of the disclosure, the terminal may determine to perform the energy saving operation when the energy saving operation of the terminal is commanded at a higher layer.

When the terminal determines to perform the energy saving operation, the terminal may determine an ADC bit resolution value for reducing the energy consumption of the terminal. In this case, the terminal may determine the ADC bit resolution value by using the following method.

According to some embodiments of the disclosure, when the terminal is to maximize an operation time, the terminal may determine that the ADC bit resolution value is set to one bit. This method may be a method of minimizing the amount of energy consumed by the ADC.

According to some embodiments of the disclosure, when the terminal is to receive as much data as possible with the same energy, the terminal may determine the ADC bit resolution value to be set in consideration of a power consumption amount of the ADC, a power consumption amount of a modem, and a unit transmission amount. Equation 2 is a method by which the terminal determines the ADC bit resolution value.

$$E_{N_{ADC}}(D) = (P_{ADC}^1 2^{N_{ADC}-1} + P_O)T_S(\lfloor D/C_{N_{ADC}} \rfloor) \qquad \text{Equation 2}$$

In Equation 2, $N_{ADC}$ denotes a bit resolution value of the ADC of the terminal, and $P_{ADC}^1$ denotes a power consumption amount of the ADC when the ADC of the terminal is set to a 1-bit resolution. $P_O$ denotes a power consumption amount of an element of the terminal other than the ADC, and Ts denotes a symbol transmission period of the terminal.

$$\lfloor D/C_{N_{ADC}} \rfloor$$

denotes the number of symbol transmissions necessary for the terminal to send D-bit data. In this case, an optimal ADC bit resolution that enables the terminal to receive as much data as possible with the same energy may be a $N_{ADC}$ value that minimizes a resultant value of Equation 2.

According to some embodiments of the disclosure, when the terminal does not desire to suffer performance degradation due to quantization noise caused by reducing the bit resolution value of the ADC, the terminal may determine a bit resolution value that causes quantization noise much less than a sum of measured thermal noise and the amount of interference of a signal received from an interfering base station as the ADC bit resolution value to be set.

Some embodiments of the disclosure related to the method of determining the ADC bit resolution value of the terminal are merely some examples, and other values may be used through numerical simulation or continuous observation of the energy saving operation of the terminal.

In operation 803, the terminal may transmit the obtained parameter and information related to the energy saving operation determination to the base station. The terminal may cause the base station to operate in accordance with the energy saving operation of the terminal by notifying the parameter obtained by the terminal and the information related to the energy saving operation determination of the terminal to the base station. The parameter obtained by the terminal may include the parameter related to the energy consumption of the terminal. The information related to the energy saving operation determination of the terminal may include information according to whether the terminal determines to perform the energy saving operation and the ADC bit resolution value determined to reduce the energy consumption of the terminal.

According to some embodiments of the disclosure, the terminal may transmit all of the parameter obtained by the terminal and the information to the base station, may transmit only part of the parameter obtained by the terminal and the information, or may transmit only the maximum MCS value according to the ADC bit resolution value determined to reduce the energy consumption of the terminal or a CQI value corresponding to the maximum MCS value.

In this case, a basic operation is an operation in which the terminal reports at least one of the maximum MCS value or the maximum CQI value according to the ADC bit resolution value determined to reduce the energy consumption of the terminal. The terminal may cause the base station to operate by limiting an MCS value by reporting at least one of the maximum MCS value or the maximum CQI value to the base station.

When the terminal desires the base station to accurately receive a state of the terminal and assist an energy operation of the terminal, the terminal may transmit all of the parameter and the information related to the energy saving operation determination of the terminal. A message including the parameter obtained by the terminal and the information related to the energy saving operation determination of the terminal and transmitted to the base station may be transmitted through a control channel and a data channel such as uplink control information (UCI), media access control-control element (MAC CE), and RRC.

According to some embodiments of the disclosure, when there is no effect when the base station operates by limiting the MCS value or when the base station does not support operating by limiting the MCS value, the terminal may omit operation 803.

In operation 804, the terminal may set the ADC bit resolution value based on the energy saving operation determination.

The terminal may perform the energy saving operation by setting the ADC bit resolution value determined in the energy saving operation determination to the bit resolution value of the ADC. Energy consumed by the terminal may be saved according to the set ADC bit resolution value.

Figure 9:
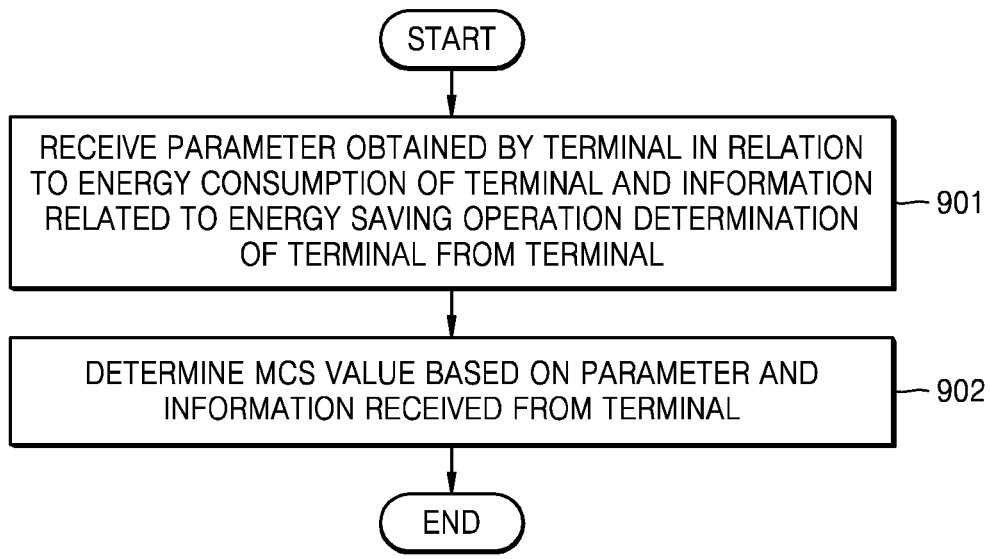
FIG. 9 illustrates a flowchart of an operation of a base station corresponding to an energy saving operation performed by a terminal according to a determination of the terminal according to some embodiments of the disclosure.

FIG. 9 illustrates a flowchart of an operation of a base station corresponding to an energy saving operation performed by a terminal according to a determination of the terminal according to some embodiments of the disclosure.

An operation of the base station of FIG. 9 may be an operation of the base station corresponding to an operation of the terminal of FIG. 8.

In operation 901, a base station may receive a parameter obtained in relation to energy consumption of a terminal and information related to an energy saving operation determination of the terminal from the terminal.

According to some embodiments of the disclosure, the parameter related to the energy consumption of the terminal and the information related to the energy saving operation determination of the terminal received by the base station from the terminal may correspond to a parameter and information transmitted by the terminal to the base station in operation 803 of FIG. 8.

According to some embodiments of the disclosure, when the base station receives at least one of a maximum MCS value according to an ADC bit resolution value determined to be set by the terminal in an energy saving operation or a maximum CQI value corresponding to the maximum MCS value, the base station may interpret that the terminal performs the energy saving operation. For example, the base station may indirectly receive a 5-bit value indicating the maximum MCS value or a 4-bit value indicating the maximum CQI value according to the ADC bit resolution value determined by the terminal through a field UCI, MAC CE, or RRC from the terminal, and may interpret that the terminal makes the energy saving operation determination.

According to some embodiments of the disclosure, the base station may obtain the maximum MCS value corresponding to the maximum CQI value by using the maximum CQI received from the terminal.

In operation 902, the base station may determine an MCS value based on the parameter and the information related to the energy saving operation determination of the terminal received from the terminal.

According to some embodiments of the disclosure, the base station may operate by limiting the MCS and CQI values based on a report of the maximum MCS or CQI value according to the ADC bit resolution value determined to be set in the energy saving operation of the terminal. A detailed explanation thereof will be given with reference to FIGS. 18 through 20.

Figure 10:
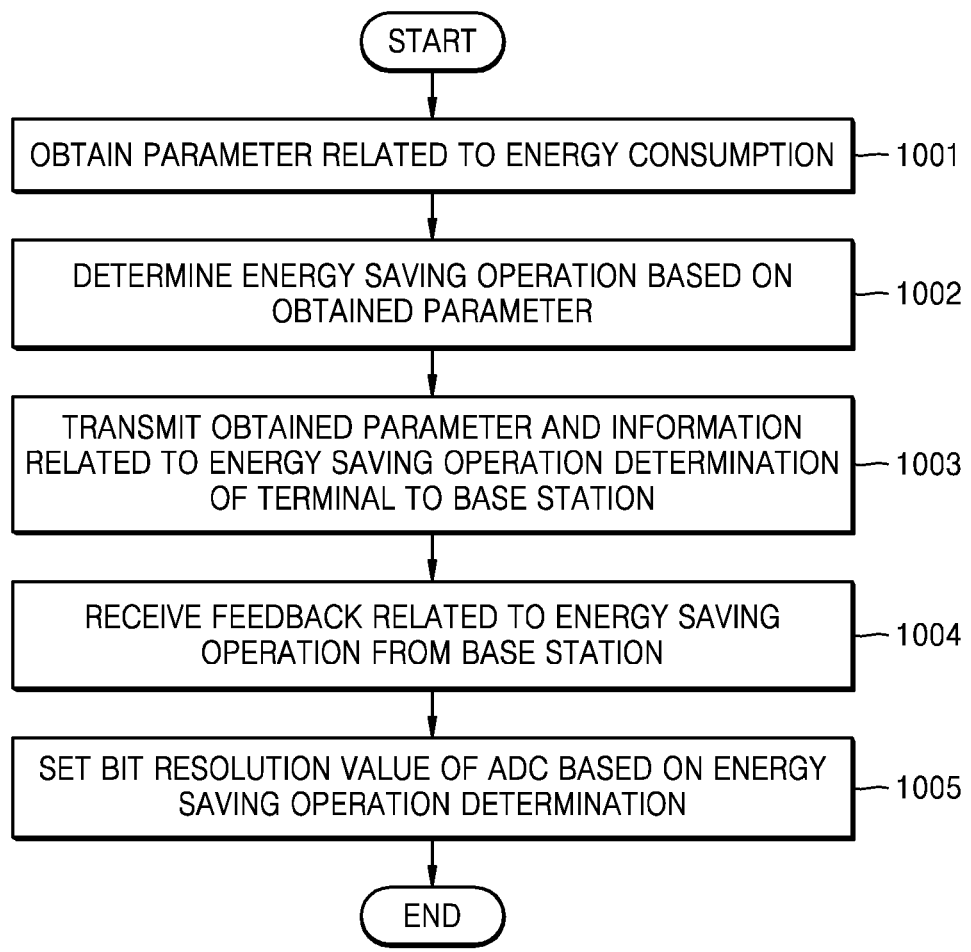
FIG. 10 illustrates a flowchart of an energy saving operation performed by a terminal through a mutual checking process with a base station according to a determination of the terminal according to some embodiments of the disclosure.
Figure 11:
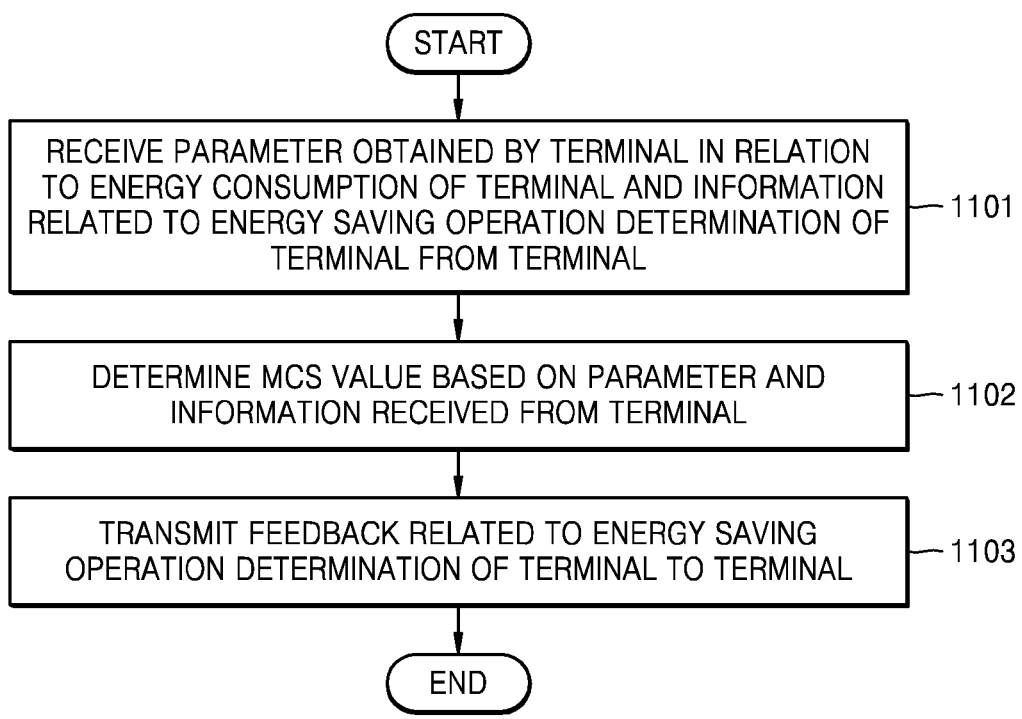
FIG. 11 illustrates a flowchart of an operation of a base station corresponding to an energy saving operation performed by a terminal through a mutual checking process with the base station according to a determination of the terminal according to some embodiments of the disclosure.

FIGS. 10 and 11 illustrate flowcharts of an operation obtained after adding a mutual checking process of a base station and a terminal to an operation of the terminal of FIG. 8 and an operation of the base station of FIG. 9. The added operation of FIGS. 10 and 11 may be omitted according to conditions of the terminal and the base station, and may be additionally performed to ensure a stable energy saving operation between the terminal and the base station.

FIG. 10 illustrates a flowchart of an energy saving operation performed by a terminal through a mutual checking process with a base station according to a determination of the terminal according to some embodiments of the disclosure.

In operation 1001, a terminal may obtain a parameter related to energy consumption. Operation 1001 may correspond to operation 801 of FIG. 8.

In operation 1002, the terminal may determine an energy saving operation based on the obtained parameter. Operation 1002 may correspond to operation 802 of FIG. 8.

In operation 1003, the terminal may transmit the obtained parameter and information related to the energy saving operation determination to abase station. Operation 1003 may correspond to operation 803 of FIG. 8.

In operation 1004, the terminal may receive a feedback related to the energy saving operation from the base station.

According to some embodiments of the disclosure, the terminal may receive the feedback related to the energy saving operation determination from the base station. For example, the terminal may receive an acknowledgement of the base station as to the energy saving operation determination from the base station, and may receive information about a parameter set by the base station in relation to the energy saving operation determined by the terminal.

For example, the terminal may receive a feedback about an MCS value determined by the base station in relation to the energy saving operation determination made by the terminal from the base station. A message indicating that the base station is to operate by limiting the MCS/CQI values may be included in the feedback about the MCS value received from the base station. Also, a feedback about the MCS value determination of the base station according to a maximum MCS value according to an ADC bit resolution value determined by the terminal and transmitted to the base station or a CQI value corresponding to the maximum MCS value may be included in the feedback about the MCS value received from the base station.

In operation 1005, the terminal may determine the ADC bit resolution value based on the energy saving operation determination. Operation 1005 may correspond to operation 804 of FIG. 8.

FIG. 11 illustrates a flowchart of an operation of a base station corresponding to an energy saving operation performed by a terminal through a mutual checking process with the base station according to a determination of the terminal according to some embodiments of the disclosure.

In operation 1101, a base station may receive a parameter obtained in relation to energy consumption of a terminal and information related to an energy saving operation determination of the terminal from the terminal. Operation 1101 may correspond to operation 901 of FIG. 9.

In operation 1102, the base station may determine an MCS value based on the parameter and the information related to the energy saving operation determination of the terminal received from the terminal. Operation 1102 may correspond to operation 902 of FIG. 9.

In operation 1103, the base station may transmit a feedback related to the energy saving operation determination of the terminal to the terminal. Operation 1103 may be an operation of the base station corresponding to operation 1004 of the terminal of FIG. 10.

According to some embodiments of the disclosure, the base station may transmit an acknowledgement of the base station as to the energy saving operation determination of the terminal to the terminal, and may transmit information about a parameter set by the base station in relation to the energy saving operation determined by the terminal to the terminal. For example, the base station may transmit a feedback about the MCS value determined by the base station in relation to the energy saving operation determination made by the terminal to the terminal.

The acknowledgement of the base station and the information about the parameter transmitted by the base station correspond to information received by the terminal in operation 1004 of FIG. 10.

Figure 12:
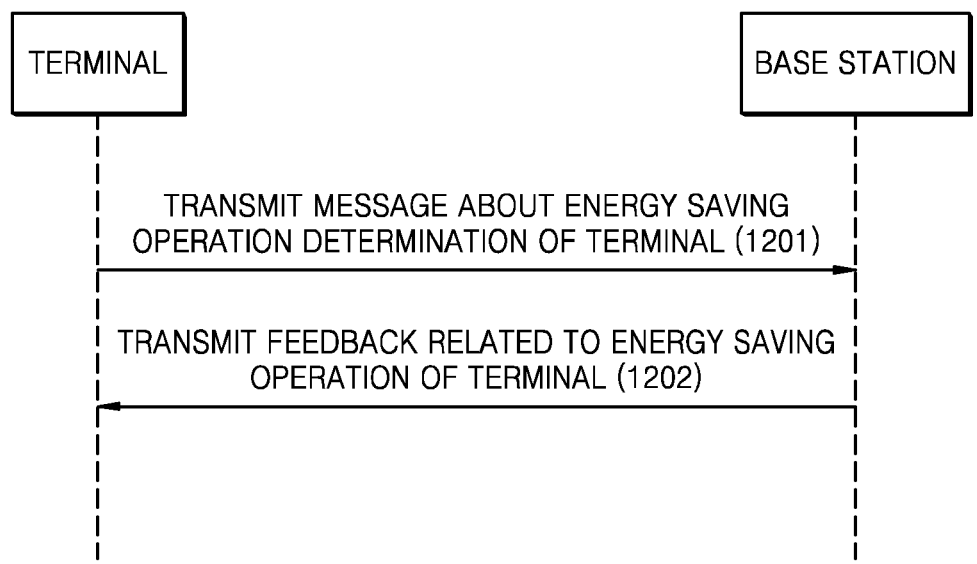
FIG. 12 illustrates a diagram of a message sequence exchanged between a terminal and a base station in an energy saving operation performed by the terminal according to some embodiments of the disclosure.

FIG. 12 illustrates a diagram of a message sequence exchanged between a terminal and a base station in an energy saving operation performed by the terminal according to a determination of the terminal according to some embodiments of the disclosure.

In operation 1201, a terminal may transmit a message about an energy saving operation determination of the terminal to a base station. The message transmitted by the terminal to the base station may be a message informed to the base station to perform an energy saving operation of the terminal, and may include a maximum MSC value or a maximum CQI value according to an ADC bit resolution value determined by the terminal to be set in the energy saving operation. Also, the message may include a parameter related to energy consumption of the terminal obtained by the terminal and information related to the energy saving operation determination of the terminal.

In operation 1202, the base station may transmit a feedback message related to the energy saving operation of the terminal to the terminal. The feedback message transmitted by the base station may include an acknowledgement of the base station as to the energy saving operation determination of the terminal and information about a parameter set by the base station in relation to the energy saving operation determined by the terminal.

Operation 1202 may be omitted according to conditions of the terminal and the base station.

According to some embodiments of the disclosure, the terminal may report a parameter related to the energy saving operation to the base station, and the base station may become a subject of the energy saving operation determination of the terminal and may determine the energy saving operation of the terminal.

Figure 13:
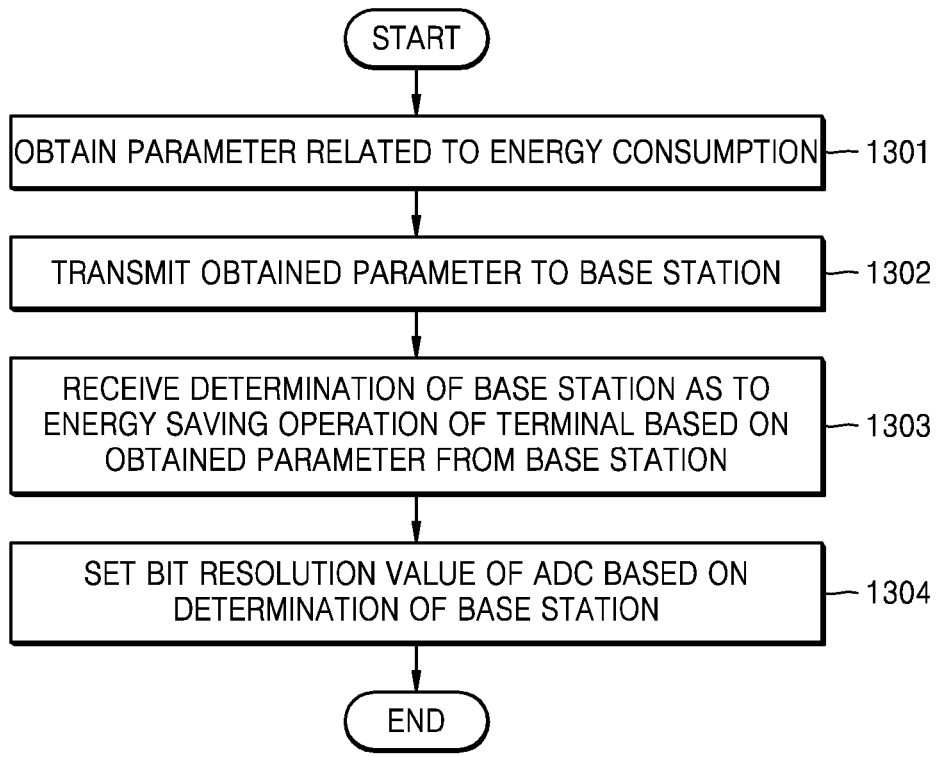
FIG. 13 illustrates a flowchart of an energy saving operation performed by a terminal according to a determination of a base station according to some embodiments of the disclosure.

FIG. 13 illustrates a flowchart of an energy saving operation performed by a terminal according to a determination of a base station according to some embodiments of the disclosure.

In operation 1301, a terminal may obtain a parameter related to energy consumption. Operation 1301 may correspond to operation 801 of FIG. 8.

In operation 1302, the terminal may transmit the obtained parameter to a base station. Operation 1302 may correspond to operation 803 in which the terminal transmits the obtained parameter to the base station of FIG. 8.

The terminal may cause the base station to determine an energy saving operation of the terminal and operate in accordance with the determined energy saving operation of the terminal by notifying the parameter obtained by the terminal to the base station. The parameter obtained by the terminal may include the parameter related to the energy consumption of the terminal. Also, the parameter obtained by the terminal may include information related to the energy saving operation determination of the terminal. The information related to the energy saving operation determination of the terminal may include information about a maximum MCS value according to an ADC bit resolution value of the terminal or a CQI value corresponding to the maximum MCS value.

According to some embodiments of the disclosure, the terminal may transmit all of the parameter obtained by the terminal to the base station, may transmit only part of the parameter obtained by the terminal, or may transmit only the maximum MCS value according to the ADC bit resolution value or the CQI value corresponding to the maximum MCS value.

In this case, a basic operation may be an operation in which the terminal reports only the maximum MCS value or a maximum CQI value to the base station according to the ADC bit resolution value. When the terminal desires the base station to accurately receive a state of the terminal and assist an energy operation of the terminal, the terminal may transmit all of the parameter. A message including the parameter obtained by the terminal and transmitted to the base station may be transmitted through a control channel and a data channel such as UCI, MAC CE, and RRC.

In operation 1303, the terminal may receive a determination of the base station as to the energy saving operation of the terminal based on the obtained parameter from the base station.

According to some embodiments of the disclosure, the determination received by the terminal from the base station may include a determination of the base station as to whether to allow the terminal to perform the energy saving operation and the ADC bit resolution value determined by the base station to be set by the terminal in the energy saving operation when the base station determines to allow the terminal to perform the energy saving operation.

In operation 1304, the terminal may set the ADC bit resolution value based on the energy saving operation determination of the base station.

According to some embodiments of the disclosure, the terminal may perform the energy saving operation by setting the ADC bit resolution value according to the determined ADC bit resolution value included in the energy saving operation determination of the base station.

Figure 14:
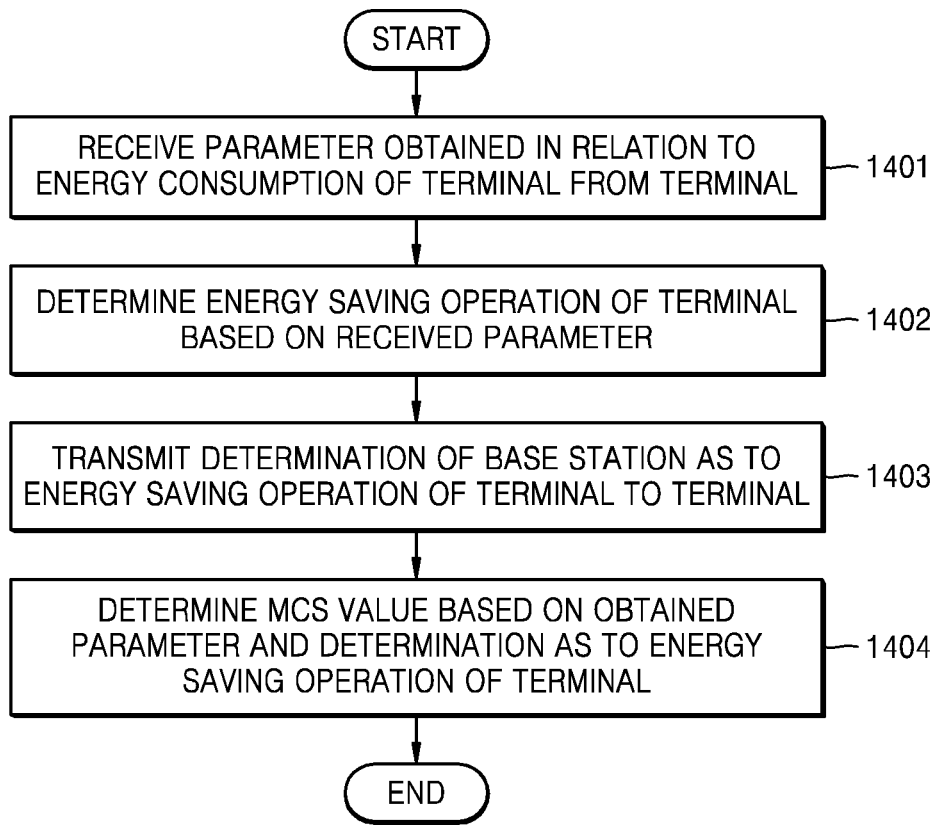
FIG. 14 illustrates a flowchart of a determination operation of a base station for an energy saving operation of a terminal according to some embodiments of the disclosure.

FIG. 14 illustrates a flowchart of a determination operation of a base station for an energy saving operation of a terminal according to some embodiments of the disclosure. An operation of the base station of FIG. 14 may be an operation of the base station corresponding to an operation of the terminal of FIG. 13.

In operation 1401, a base station may receive a parameter obtained in relation to energy consumption of a terminal from the terminal.

According to some embodiments of the disclosure, the parameter obtained by the base station in relation to the energy consumption of the terminal received from the terminal may correspond to a parameter transmitted by the terminal to the base station in operation 1301 of FIG. 13.

According to some embodiments of the disclosure, when the base station receives a maximum MCS value or a maximum CQI value according to an ADC bit resolution value settable by the terminal in an energy saving operation, the base station may interpret that the terminal may support the energy saving operation. For example, when a value other than 0 is allocated to a 5-bit value indicating the maximum MCS value or a 4-bit value indicating the maximum CQI value according to the ADC bit resolution value settable by the terminal in the energy saving operation in a field UCI, MAC CE, or RRC received from the terminal, the base station may indirectly detect that the terminal may support the energy saving operation.

In operation 1402, the base station may determine the energy saving operation of the terminal based on the received parameter.

According to some embodiments of the disclosure, the base station may determine whether to allow the terminal to perform the energy saving operation. The base station may determine the energy saving operation of the terminal by comparing the received parameter with a pre-set threshold value. For example, when the received parameter is less than the pre-set threshold value, the base station may determine that the terminal is to perform the energy saving operation.

According to some embodiments of the disclosure, when the base station determines that the terminal is to perform the energy saving operation, the base station may determine the ADC bit resolution value to be set by the terminal. In this case, a method in which the base station determines the ADC bit resolution value of the terminal may correspond to a method in which the terminal determines the ADC bit resolution value in operation 802 of FIG. 8.

In operation 1403, the base station may transmit a determination of the base station as to the energy saving operation of the terminal to the terminal. Operation 1403 of the base station may be an operation of the base station corresponding to operation 1303 of the terminal of FIG. 13.

According to some embodiments of the disclosure, the determination transmitted by the base station may include whether to allow the terminal to perform the energy saving operation, and the ADC bit resolution value to be set by the terminal in the energy saving operation when the base station determines to allow the terminal to perform the energy saving operation.

In operation 1404, the base station may determine an MCS value based on the received parameter and the determination as to the energy saving operation of the terminal.

According to some embodiments of the disclosure, the base station may operate by limiting the MCS and CQI values based on a report of at least one of the maximum MCS value or the maximum CQI value according to the ADC bit resolution value in the energy saving operation of the terminal. The base station may receive the report of the maximum MCS value and the maximum CQI value according to the determined ADC bit resolution value from the terminal, and may obtain the maximum MCS value and the maximum CQI value according to the determined ADC bit resolution value based on the report of the maximum MCS value and the maximum CQI value according to the specific ADC bit resolution value. A detailed explanation thereof will be given with reference to FIGS. 18 through 20.

Figure 15:
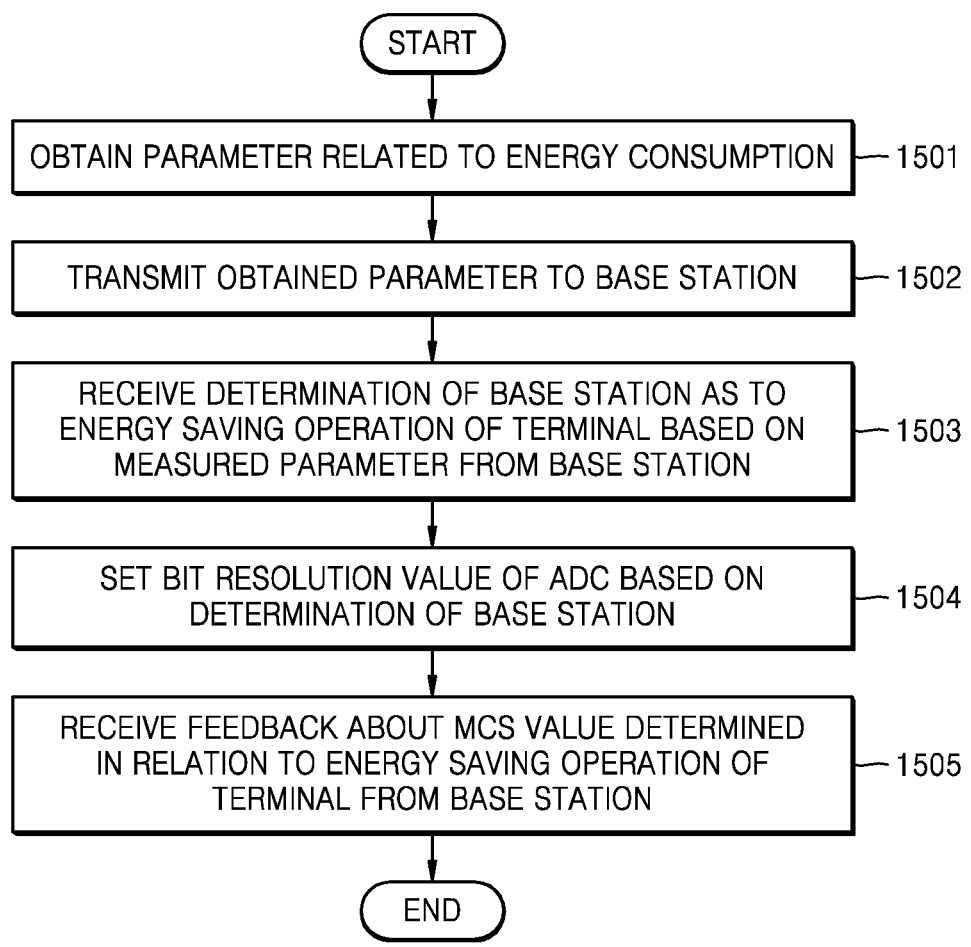
FIG. 15 illustrates a flowchart of an energy saving operation performed by a terminal through a mutual checking process with a base station according to a determination of the base station according to some embodiments of the disclosure.
Figure 16:
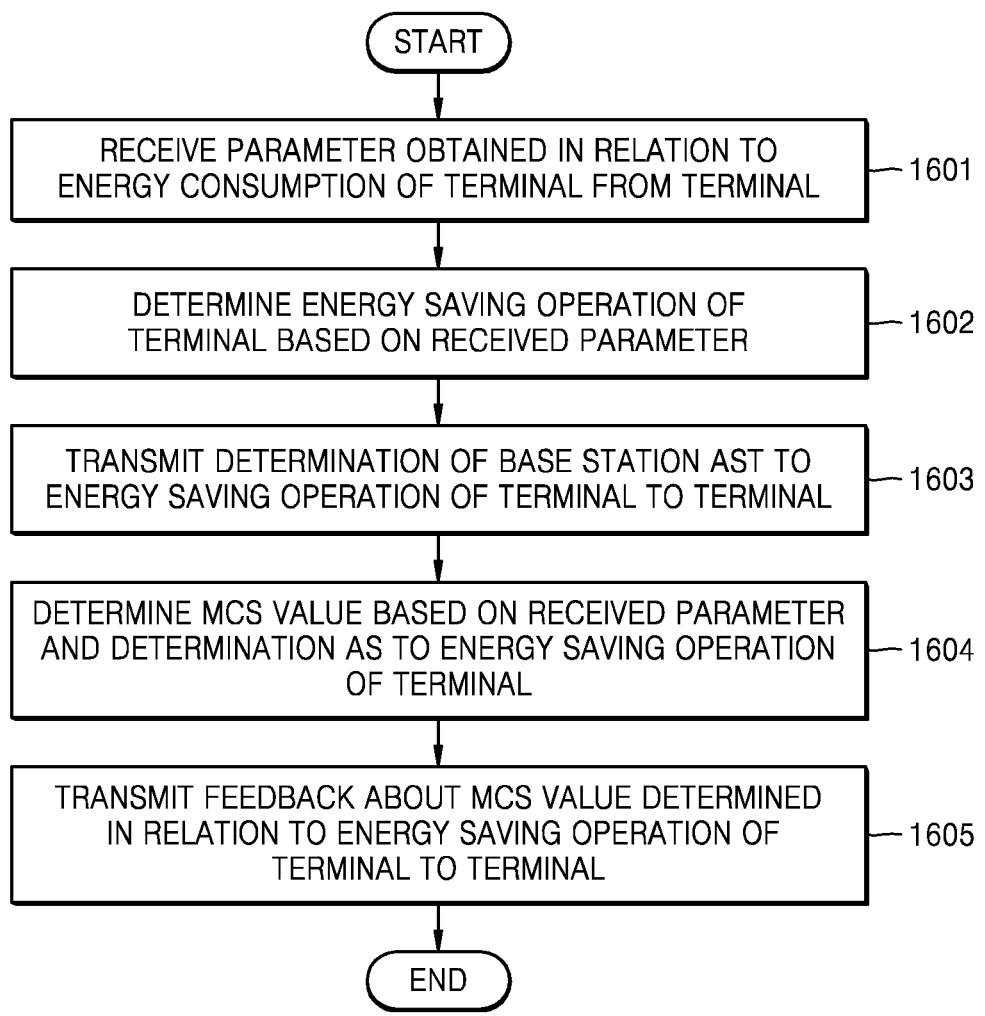
FIG. 16 illustrates a flowchart of an operation of a base station corresponding to an energy saving operation performed by a terminal through a mutual checking process with the base station according to a determination of the base station according to some embodiments of the disclosure.

FIGS. 15 and 16 illustrate flowcharts of an operation obtained after adding a mutual checking process of a base station and a terminal to an operation of the terminal of FIG. 13 and an operation of the base station of FIG. 14. The added operation of FIGS. 15 and 16 may be omitted according to conditions of the terminal and the base station, and may be additionally performed to ensure a stable energy saving operation between the terminal and the base station.

FIG. 15 illustrates a flowchart of an energy saving operation performed by a terminal through a mutual checking process with a base station according to a determination of the base station according to some embodiments of the disclosure.

In operation 1501, a terminal may obtain a parameter related to energy consumption. Operation 1501 may correspond to operation 1301 of FIG. 13.

In operation 1502, the terminal may transmit the obtained parameter to a base station. Operation 1502 may correspond to operation 1302 of FIG. 13.

In operation 1503, the terminal may receive a determination of the base station as to an energy saving operation of the terminal based on the obtained parameter from the base station. Operation 1503 may correspond to operation 1303 of FIG. 13.

In operation 1504, the terminal may set an ADC bit resolution value based on the determination of the base station. Operation 1504 may correspond to operation 1303 of FIG. 13.

In operation 1505, the terminal may receive a feedback about an MCS value determined by the base station in relation to the energy saving operation of the terminal from the base station.

According to some embodiments of the disclosure, a message indicating that the base station is operate by limiting MCS/CQI values may be included in the feedback about the MCS value received from the base station. Also, a feedback about the MCS value determination of the base station according to a maximum MCS value corresponding to the determined ADC bit resolution value transmitted by the terminal to the base station or a CQI value corresponding to the maximum MCS value may be included in the feedback about the MCS value received from the base station.

Through operation 1505, the terminal may detect that the base station does not directly use the maximum MCS value or a maximum CQI value reported by the terminal and changes the maximum MCS and CQI values and then uses the maximum MCS and CQI values, and may check again the maximum MCS and CQI values between the terminal and the base station.

FIG. 16 illustrates a flowchart of an operation of a base station corresponding to an energy saving operation performed by a terminal through a mutual checking process with the base station according to a determination of the base station according to some embodiments of the disclosure.

In operation 1601, a base station may receive a parameter obtained in relation to energy consumption of a terminal from the terminal. Operation 1601 may correspond to operation 1401 of FIG. 14.

In operation 1602, the base station may determine an energy saving operation of the terminal based on the received parameter. Operation 1602 may correspond to operation 1402 of FIG. 14.

In operation 1603, the base station may transmit a determination of the base station as to the energy saving operation of the terminal to the terminal. Operation 1603 may correspond to operation 1403 of FIG. 14.

In operation 1604, the base station may determine an MCS value based on the received parameter and the determination as to the energy saving operation of the terminal. Operation 1604 may correspond to operation 1404 of FIG. 14.

In operation 1605, the base station may transmit a feedback about the MCS value determined by the base station in relation to the energy saving operation of the terminal to the terminal.

According to some embodiments of the disclosure, a message indicating that the base station is to operate by limiting the MCS/CQI values may be included in the feedback about the MCS value transmitted to the terminal. Also, a feedback about the MCS value determination of the base station according to a maximum MCS value according to a determined ADC bit resolution value transmitted by the terminal to the base station or a CQI value corresponding to the maximum MCS value may be included in the feedback about the MCS value transmitted to the terminal.

In operation 1605, the terminal may detect that the base station does not directly use the maximum MCS value or a maximum CQI value reported by the terminal and changes the maximum MCS and CQI values and then uses the maximum MCS and CQI values, and may check again the maximum MCS and CQI values between the terminal and the base station.

Figure 17:
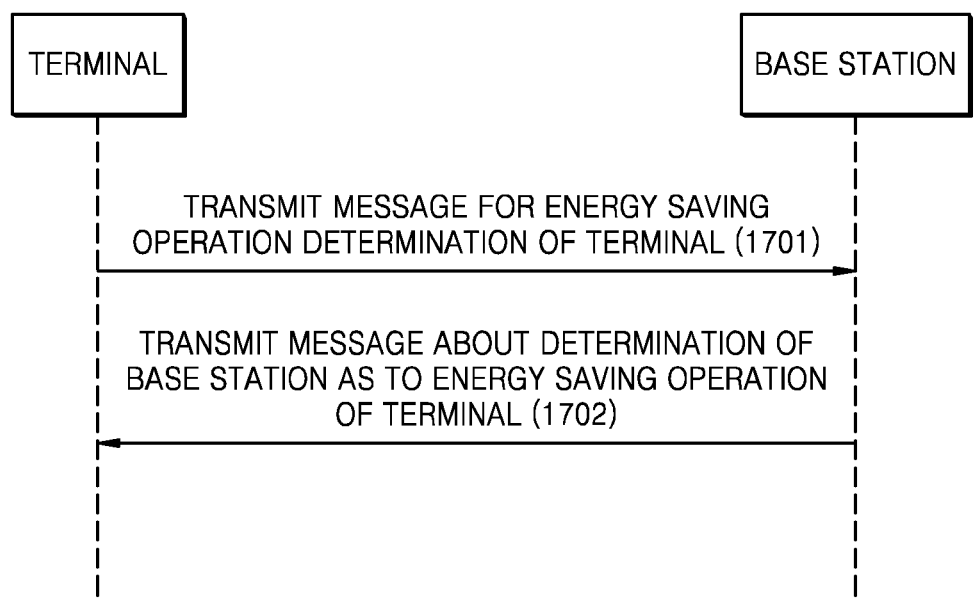
FIG. 17 illustrates a diagram of a message sequence exchanged between a terminal and a base station in an energy saving operation performed by the terminal according to a determination of the base station according to some embodiments of the disclosure.

FIG. 17 illustrates a diagram of a message sequence exchanged between a terminal and a base station in an energy saving operation performed by the terminal according to a determination of the base station according to some embodiments of the disclosure.

In operation 1701, a terminal may transmit a message for an energy saving operation determination of the terminal to a base station. The message transmitted by the terminal to the base station may include information which the base station has to know for the energy saving operation determination of the terminal, and may include a maximum MSC value or a maximum CQI value that may be used by the base station according to an ADC bit resolution value in an energy saving operation of the terminal.

In operation 1702, the base station may transmit a message about a determination of the base station as to the energy saving operation of the terminal. The message may include a determination of the base station as to whether to allow the terminal to perform the energy saving operation and the ADC bit resolution value to be set when the energy saving operation is performed.

According to some embodiments of the disclosure, the terminal may perform channel reporting to the base station with the maximum CQI value and the maximum MCS value according to the ADC bit resolution value determined according to the energy saving operation determination, the base station may determine an MCS value based on the channel reporting of the terminal and may encode data, and the terminal may receive data decoded according to the determined MCS value from the base station.

Figure 18:
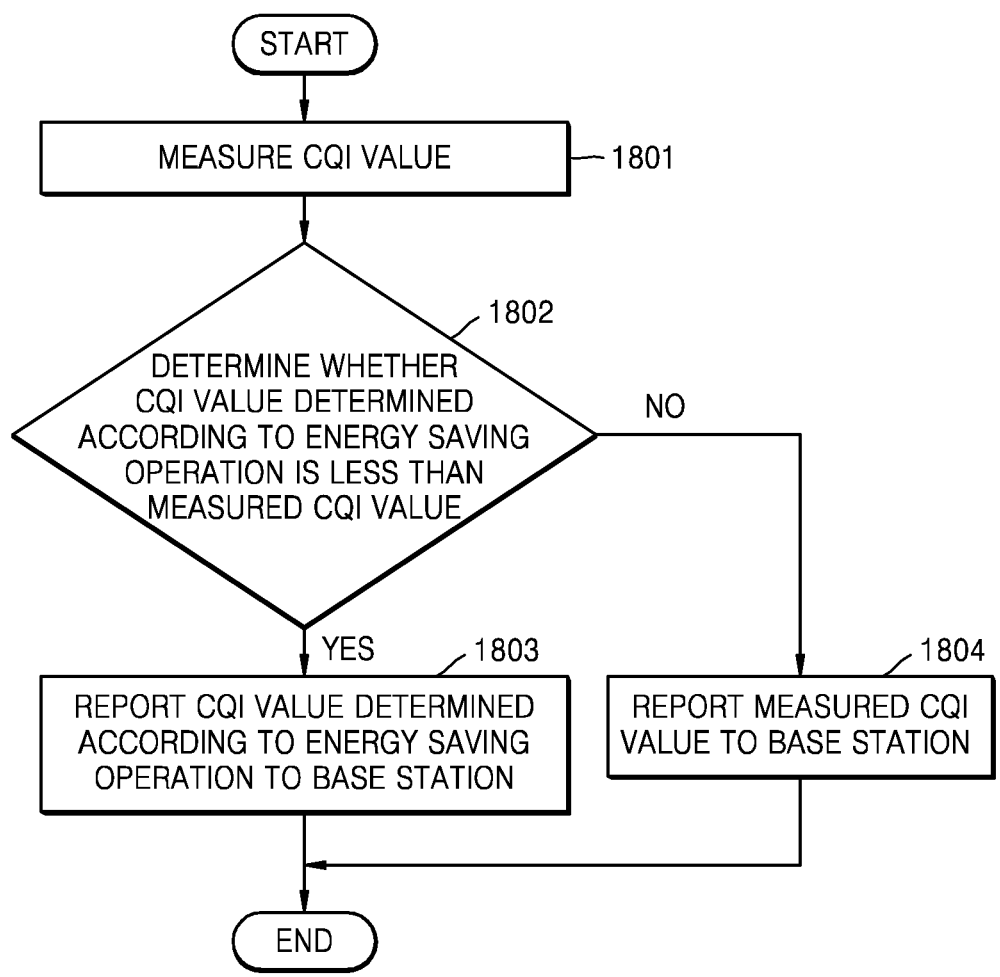
FIG. 18 illustrates a flowchart of a process in which a terminal performs channel reporting to a base station based on a determined energy saving operation according to some embodiments of the disclosure.

FIG. 18 illustrates a flowchart of a process in which a terminal performs channel reporting to a base station based on a determined energy saving operation according to some embodiments of the disclosure.

In operation 1801, a terminal may measure a CQI value.

According to some embodiments of the disclosure, the terminal may determine a channel state with a base station and may measure the CQI value.

In operation 1802, the terminal may compare the measured CQI value with a maximum CQI value determined according to a determined energy saving operation. The determined maximum CQI value may correspond to a maximum MCS value according to an ADC bit resolution value set in the determined energy saving operation.

In operations 1803 and 1804, the terminal may report a smaller value between the measured CQI value and the determined maximum. CQI value to the base station. Because the maximum CQI value that may be used by the base station may be limited by adjusting the ADC bit resolution value for reducing energy consumption of the terminal according to the disclosure, the terminal may report in advance the CQI value that may be limited by the base station to the base station.

Figure 19:
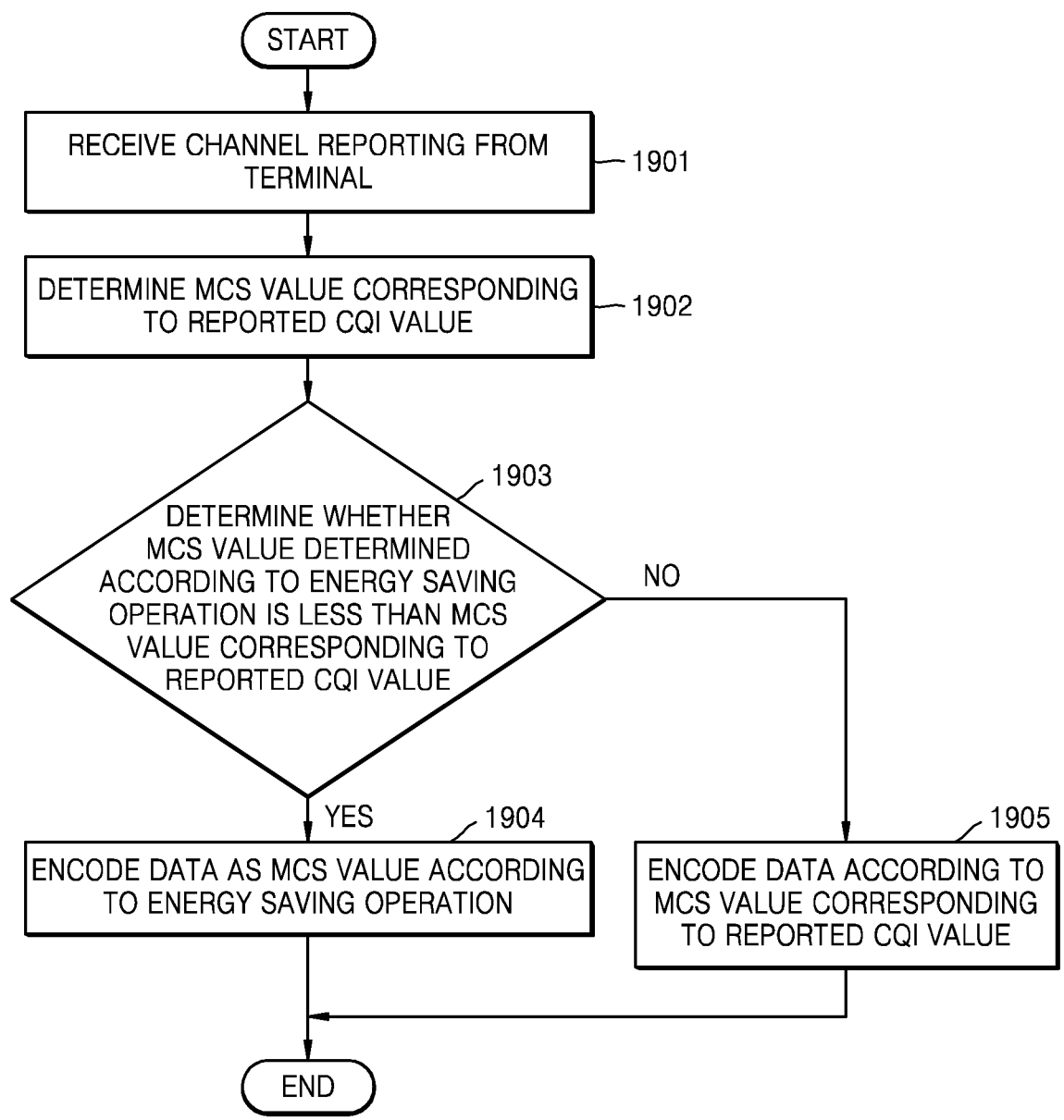
FIG. 19 illustrates a flowchart of an operation in which a base station determines an MCS value and encodes data, based on a channel reporting based on a determined energy saving operation of a terminal according to some embodiments of the disclosure.

FIG. 19 illustrates a flowchart of an operation in which a base station determines an MCS value and encodes data based on channel reporting based on a determined energy saving operation of a terminal according to some embodiments of the disclosure.

In operation 1901, a base station may receive channel reporting based on a determined energy saving operation from a terminal.

According to some embodiments of the disclosure, a CQI reported as a smaller value between a CQI value measured by the terminal and a maximum CQI value determined by the terminal according to the determined energy saving operation may be included in the channel reporting of the terminal.

In operation 1902, the base station may determine an MCS value corresponding to the reported CQI value.

In operation 1903, the base station may compare the MCS value corresponding to the reported CQI value with a maximum MCS value determined according to the determined energy saving operation. The determined maximum MCS value may be a maximum MCS value according to an ADC bit resolution value set in the determined energy saving operation.

In operations 1904 and 1905, the base station may determine a smaller value between the MCS value corresponding to the reported CQI value and the determined maximum MCS value as an MCS value to be used, may encode data according to the MCS value, to be used, and may transmit the encoded data to the terminal. Because the base station operates by limiting the maximum MCS value in the disclosure, the base station may not directly use an MCS value determined by a CQI feedback of the terminal and may use a smaller value between the maximum MCS value determined according to the energy saving operation of the terminal and the MCS value determined through the channel feedback as a final MCS value and may transmit data to the terminal.

Figure 20:
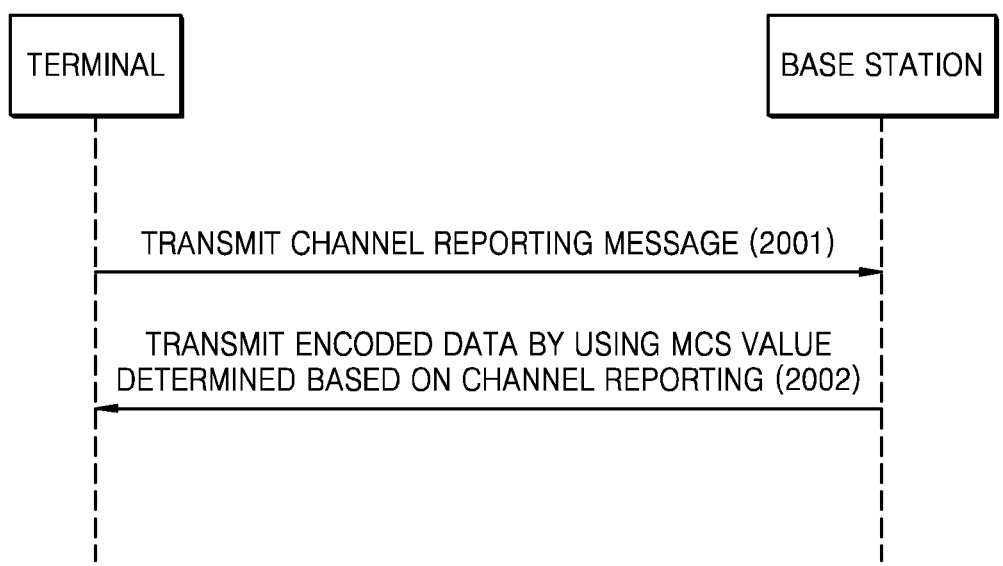
FIG. 20 illustrates a diagram of a message sequence exchanged for data transmission between a terminal and a base station after setting an energy saving operation of the terminal and the base station according to some embodiments of the disclosure.

FIG. 20 illustrates a diagram of a message sequence exchanged for data transmission between a terminal and a base station after setting an energy saving operation between the terminal and the base station according to some embodiments of the disclosure.

In operation 2001, a terminal may transmit a CQI reporting message to a base station. Operation 2001 may correspond to an operation of the terminal of FIG. 18.

In operation 2002, the base station may determine an MCS value to be used based on the received CQI reporting message, may encode data by using the determined MCS value, and may transmit the encoded data to the terminal. Operation 2002 may correspond to an operation of the base station of FIG. 19.

FIG. 21 illustrates a diagram of an example where a CQI value usable by a base station is limited according to an energy saving operation of a terminal according to some embodiments of the disclosure.

Referring to FIG. 21, a dark portion in a CQI table indicates CQIs that may not be used by a base station because a maximum CQI value is limited when an ADC bit resolution of a terminal is set to 0.2 bits according to an energy saving operation of the terminal. A CQI table when an ADC bit resolution is set to bits other than 2 bits according to the energy saving operation of the terminal may be obtained from Table 9. In this case, the terminal and the base station may operate by reducing the number of bits in a CQI field of UCI by 1 bit.

FIG. 22 illustrates a diagram of an example where an MCS value usable by a base station is limited according to an energy saving operation of a terminal according to some embodiments of the disclosure.

Referring to FIG. 22, a dark portion in an MCS table indicates MCSs that may not be used by a base station because a maximum MCS value is limited when an ADC bit resolution of a terminal is set to 2 bits according to an energy saving operation of the terminal. An MCS table when an ADC bit resolution is set to bits other than 2 bits according to the energy saving operation of the terminal may be obtained from Equation 9. In this case, the terminal and the base station may operate by reducing the number of bits of an MCS field of DCI by 1 bit.

Figure 23:
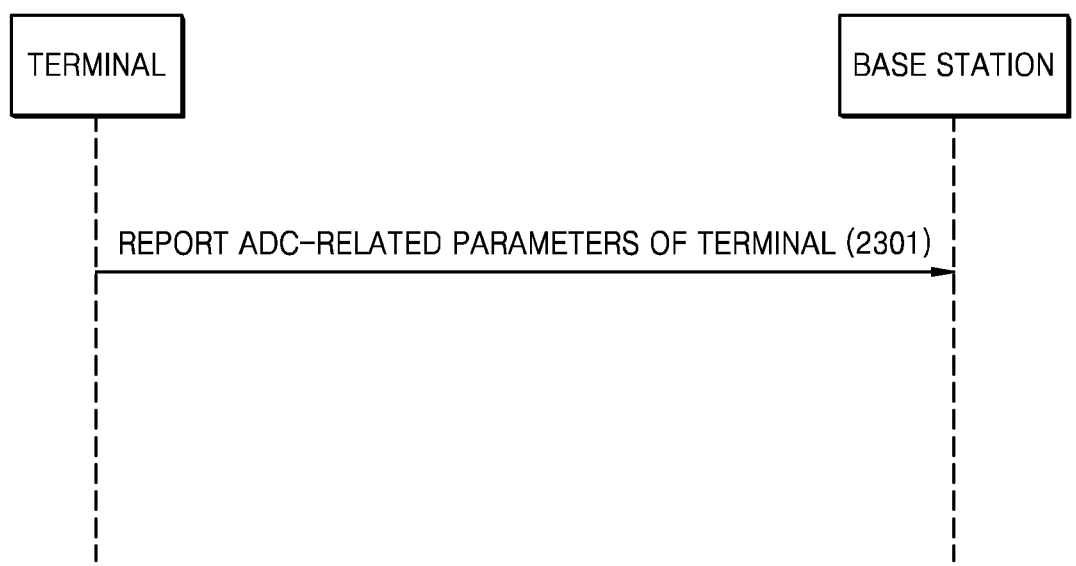
FIG. 23 illustrates a diagram of a method in which a terminal reports an ADC bit resolution value usable by the terminal to a base station and the base station operates by determining MCS and CQI values according to the reported ADC bit resolution value according to some embodiments of the disclosure.

FIG. 23 is a diagram of a method in which a terminal reports an ADC bit resolution value usable by the terminal to a base station and the base station operates by determining MCS and CQI values according to the reported ADC bit resolution value according to some embodiments of the disclosure.

According to some embodiments of the disclosure, as the terminal reports only one ADC bit resolution value usable by the terminal to the base station, reports a plurality of ADC bit resolution values, or does not report an ADC bit resolution value, the base station may differently perform MCS and CQI optimization. When the terminal reports only one bit resolution value usable by the terminal to the base station, the base station may accordingly optimize an MCS and CQI operation.

Referring to FIG. 23, the terminal may report ADC-related parameters of the terminal to the base station in a process such as RRC configuration or initial access to the base station. In this case, the ADC-related parameters of the terminal may include an ADC bit resolution value usable by the terminal. The terminal may transmit an ADC bit resolution range in which the terminal may operate or a fixed ADC bit resolution value to the base station. When the ADC-related parameters are not received from the terminal, the base station may determine that the terminal is unable to adjust an ADC bit resolution value and the terminal is not a terminal corresponding to a specific bit resolution value. Accordingly, the base station may not perform an MCS and CQI mapping operation according to the specific bit resolution value described in the above embodiments, and may perform an MCS and CQI mapping operation in the same manner as an existing operation.

According to some embodiments of the disclosure, when the terminal transmits a plurality of ADC bit resolution values usable by the terminal to the base station, the base station may determine that the terminal may operate by adjusting an ADC bit resolution value, and may perform an ADC bit resolution adjusting operation through ADC bit resolution adjustment described in the above embodiments.

According to some embodiments of the disclosure, when the terminal transmits only one ADC bit resolution value usable by the terminal to the base station, the base station may operate by assuming that the terminal is unable to set an ADC bit resolution value. However, the base station may operate by performing CQI and MCS optimization according to the ADC bit resolution value transmitted by the terminal.

For example, when the terminal reports one ADC bit resolution value usable by the terminal and set to 4-bits, it may assumed that the base station operating by limiting, regarding MCS level that the terminal may receive, a maximum MCS value to 17 and a maximum CQI value to 10 as described above. That is, the terminal and the base station may operate by assuming that bits set as an optimal ADC bit resolution value in the above embodiments are the same as the ADC bit resolution value usable by the terminal.

Accordingly, in the embodiment of FIG. 23, when the base station detects that only one ADC bit resolution value of the terminal is settable, the base station and the terminal may operate by performing a process of setting an optimal ADC bit resolution value between the base station and the terminal.

Figure 24:
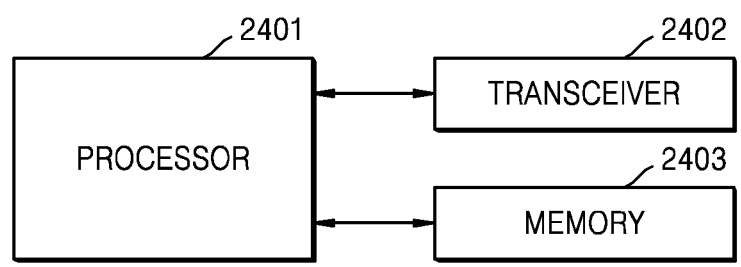
FIG. 24 illustrates a block diagram of a structure of a base station according to some embodiments of the disclosure.
Figure 25:
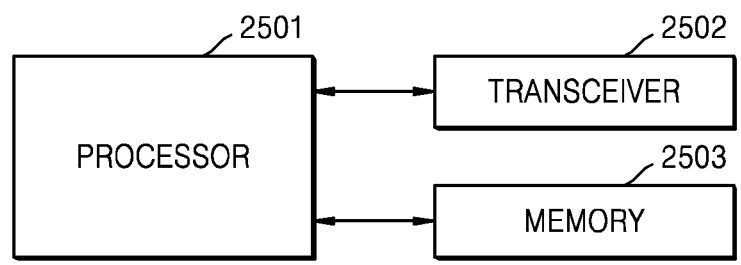
FIG. 25 illustrates a block diagram of a structure of a terminal according to some embodiments of the disclosure.

A transceiver, a processor, and a memory of each of a base station and a terminal for performing the embodiments of the disclosure are illustrated in FIGS. 24 and 25. A transmission/reception method of the base station and the terminal for applying a method of transmitting/receiving a DL control channel and a data channel in a communication system corresponding to the embodiments of the disclosure is provided, and to perform this method, the transceiver, the processor, and the memory of each of the base station and the terminal has to operate according to each embodiment of the disclosure.

FIG. 24 illustrates a block diagram of a structure of a base station according to some embodiments of the disclosure.

Referring to FIG. 24, the base station may include a processor 2401, a transceiver 2402, and a memory 2403. However, elements of the base station are not limited thereto. For example, the base station may include elements more or fewer than those illustrated in FIG. 24. In addition, the processor 2401, the transceiver 2402, and the memory 2403 may be implemented into one chip.

According to some embodiments of the disclosure, the processor 2401 may control a series of processes so that the base station may operate according to embodiments of the disclosure. For example, the processor 2401 may control DL control channel allocation and transmission using an OFDM signal, RS, and data channel resource mapping transmission/reception method according to an embodiment of the disclosure. The processor 2401 may include a plurality of processors, and the processor 2401 may, by executing a program stored in the memory 2403, control at least one of a maximum MCS value usable by the base station according to an ADC bit resolution value for reducing energy consumption of the terminal or a CQI value corresponding to the maximum MCS value to be received from the terminal and an MCS value to be determined based on at least one of the maximum MCS value or the CQI value corresponding to the maximum MCS value.

The transceiver 2402 may transmit/receive a signal to/from the terminal. The signal transmitted/received to/from the terminal may include control information and data. According to some embodiments of the disclosure, the transceiver 2402 may include an RF transmitter that up-converts and amplifies a frequency of a transmitted signal, and an RF receiver that performs low-noise amplification on a received signal and down-converts a frequency. However, the transceiver 2402 may, be an example, and elements of the transceiver 2402 are not limited to the RF transmitter and the RF receiver. Also, the transceiver 2402 may receive a signal through a wireless channel and may output the signal to the processor 2401, and may transmit a signal output from the processor 2401 through the wireless channel.

According to some embodiments of the disclosure, the memory 2403 may store a program and data necessary to operate the base station. Also, the memory 2403 may store control information and data included in a signal transmitted/received to/from the base station. The memory 2403 may include a storage medium such as a read-only memory (ROM), a random-access memory (RAM), a hard disc, a compact disc-ROM (CD-ROM), or a digital versatile disk (DVD), or a combination thereof. Also, the memory 2403 may include a plurality of memories. According to some embodiments of the disclosure, the memory 2403 may store a program for transmitting/receiving a modulation signal, and may store a program for setting a group modulation method and transmitting/receiving a group modulation method.

FIG. 25 illustrates a block diagram of a structure of a terminal according to some embodiments of the disclosure.

Referring to FIG. 25, the terminal may include a processor 2501, a transceiver 2502, and a memory 2503. However, elements of the terminal are not limited thereto. For example, the terminal may include elements more or fewer than those illustrated in FIG. 25. In addition, the processor 2501, the transceiver 2502, and the memory 2503 may be implemented into one chip.

According to some embodiments of the disclosure, the processor 2501 may control a series of processes of the terminal according to embodiments of the disclosure. For example, the processor 2501 of the terminal may control DL control channel reception using an OFDM signal, RS, and data channel transmission/reception method according to an embodiment of the disclosure. The processor 2501 may include a plurality of processors, and the processor 2501 may, by executing a program stored in the memory 2503 control a parameter related to energy consumption of the terminal to be obtained, an ADC bit resolution value for reducing the energy consumption of the terminal to be determined based on the obtained parameter, and the ADC bit resolution value to be set as the determined bit resolution value.

According to some embodiments of the disclosure, the transceiver 2502 may transmit/receive a signal to/from a base station. The signal transmitted/received to/from the base station may include control information and data. According to some embodiments of the disclosure, the transceiver 2502 may include an RF transmitter that up-converts and amplifies a frequency of a transmitted signal, and an RF receiver that performs low-noise amplification on a received signal and down-converts a frequency. However, the transceiver 2502 may be an example, and elements of the transceiver 2502 are not limited to the RF transmitter and the RF receiver. Also, the transceiver 2502 may receive a signal through a wireless channel and may output the signal to the processor 2501, and may transmit a signal output from the processor 2501 through the wireless channel.

According to some embodiments of the disclosure, the memory 2503 may store a program and data necessary to operate the terminal. Also, the memory 2503 may store control information and data included in a signal transmitted/received to/from the terminal. The memory 2503 may include a storage medium such as a ROM, a RAM, a hard disk, a CD-ROM, or a DVD, or a combination thereof. Also, the memory 2503 may include a plurality of memories. According to some embodiments of the disclosure, the memory 2503 may store a program for transmitting/receiving a modulation signal, and may store a program for setting a group modulation method and transmitting/receiving a group modulation method.

The methods according to claims of the disclosure and/or embodiments of the disclosure described in the specification of the disclosure may be implemented as hardware, software, or combination of hardware and software.

When a method is implemented by software, a computer-readable storage medium for storing one or more programs (software modules) may be provided. The one or more programs stored in the computer-readable storage medium are configured to be executed by one or more processors in an electronic device. The one or more programs include instructions for allowing the electronic device to execute the methods according to the claims of the disclosure or the embodiments of the disclosure described in the specification of the disclosure.

These programs. (software module and software) may be stored in a RAM, a non-volatile memory including a flash memory, a ROM, an electrically erasable programmable read only memory (EEPROM), a magnetic disc storage device, a CD-ROM, a DVD, another optical storage device, or a magnetic cassette. Alternatively, the programs may be stored in a memory configured by combining some or all of them. Also, the configured memory may include a plurality of memories.

Also, the programs may be stored in an attachable storage device accessible through a communication network such as the Internet, an intranet, a Local Area Network (LAN), a Wide LAN (WLAN), or a Storage Area Network (SAN) or a communication thereof. This storage device may connect to a device according to embodiments of the disclosure through an external port. Also, a separate storage device on a communication network may connect to a device according to embodiments of the disclosure.

According to one or more embodiments of the disclosure, energy consumption of a terminal in a wireless communication system may be effectively reduced.

In specific embodiments of the disclosure described above, components included in the disclosure were expressed as a single or plural in accordance with the specific embodiments of the disclosure set forth. However, singular or plural representations are selected appropriately for the sake of convenience of description, the disclosure is not limited to the singular or plural constituent elements, and even expressed as a singular element, it may be composed of plural elements, and vice versa.

These disclosures may, however, be embodied in different forms and should not be construed as limited to embodiments of the disclosure set forth herein; rather, these embodiments of the disclosure are provided so that this disclosure is thorough and complete. That is, it will be obvious to one of ordinary skill in the art that various modifications may be made based on the technical scope of the disclosure. Also, embodiments of the disclosure may be performed in combination. For example, parts of an embodiment and another embodiment of the disclosure may be combined with each other to enable a base station and a terminal to operate. Also, embodiments of the disclosure may be applied to other communication systems, and other modifications based on the technical scope of the embodiments of the disclosure may be made.

Although the present disclosure has been described with various embodiments, various changes and modifications may be suggested to one skilled in the art. It is intended that the present disclosure encompass such changes and modifications as fall within the scope of the appended claims.

What is claimed is:

1. An operation method of a terminal for reducing energy consumption of the terminal by adjusting a bit resolution value of an analog-to-digital converter (ADC), the operation method comprising:
   obtaining a parameter related to the energy consumption of the terminal;
   determining the bit resolution value of the ADC for reducing the energy consumption of the terminal, based on the obtained parameter; and
   setting the bit resolution value of the ADC as the determined bit resolution value.

2. The operation method of claim 1, wherein the parameter related to the energy consumption of the terminal comprises:
a maximum modulation and coding scheme (MCS) value; and
a channel quality indicator (CQI) value corresponding to the maximum MCS value usable by a base station for the terminal so that a transmission error of a signal received from the base station is equal to or less than a specific error rate according to the bit resolution value of the ADC.

3. The operation method of claim 2, wherein the parameter related to the energy consumption of the terminal further comprises:
at least one of a channel intensity between the base station and the terminal, an intensity of interference with the signal received from the base station, thermal noise of the signal received from the base station, an energy consumption amount of the terminal, a residual energy amount of the terminal, a bit resolution range settable by the ADC, or a signal-to-quantization noise ratio (SQNR) of the signal received from the base station according to the bit resolution value of the ADC.

4. The operation method of claim 2; wherein the determining of the bit resolution value of the ADC for reducing the energy consumption of the terminal comprises:
determining the bit resolution value of the ADC for reducing the energy consumption of the terminal by comparing the obtained parameter with a pre-set threshold value.

5. The operation method of claim 4, further comprising:
transmitting, to the base station, the maximum MCS value according to the determined bit resolution value or the CQI value corresponding to the maximum MCS value according to the determined bit resolution value.

6. The operation method of claim 5, further comprising:
measuring a CQI value; and
reporting, to the base station, a smaller value between the measured CQI value and the CQI value corresponding to the maximum MCS value according to the determined bit resolution value as the CQI value.

7. The operation method of claim 6; further comprising:
receiving, from the base station, data encoded according to an MCS value determined by the base station,
wherein a smaller value between an MCS value corresponding to the reported CQI value and the maximum MCS value according to the determined bit resolution value is determined by the base station as the determined MCS value.

8. The operation method of claim 1, wherein the determining of the bit resolution value of the ADC for reducing the energy consumption of the terminal comprises:
transmitting the obtained parameter to a base station;
receiving, from the base station, the bit resolution value of the ADC for reducing the energy consumption of the terminal determined by the base station based on the obtained parameter; and
determining the bit resolution value of the ADC for reducing the energy consumption of the terminal as the received bit resolution value.

9. An operation method of a base station for reducing energy consumption of a terminal by adjusting a bit resolution value of an analog-to-digital converter (ADC) of the terminal, the operation method comprising:
receiving, from the terminal, at least one of a maximum modulation and coding scheme (MCS) value or a channel quality indicator (CQI) value corresponding to the maximum MCS value usable by the base station for the terminal according to the bit resolution value of the ADC for reducing the energy consumption of the terminal; and
determining an MCS value, based on at least one of the maximum MCS value or the CQI value corresponding to the maximum MCS value.

10. The operation method of claim 9, wherein the maximum MCS value and the CQI value corresponding to the maximum MCS value are obtained by the terminal,
wherein the maximum MCS value comprises:
the maximum MCS value usable by the base station for the terminal so that a transmission error of a signal received by the terminal from the base station is equal to or less than a specific error rate, according to the bit resolution value of the ADC for reducing the energy consumption of the terminal.

11. The operation method of claim 9, wherein the bit resolution value of the ADC for reducing the energy consumption of the terminal is determined by the terminal, based on a parameter related to the energy consumption of the terminal obtained by the terminal.

12. The operation method of claim 11, wherein the parameter related to the energy consumption of the terminal comprises:
the maximum modulation and coding scheme (MCS) value and the channel quality indicator (CQI) value corresponding to the maximum MCS value usable by the base station for the terminal so that a transmission error of a signal received from the base station is equal to or less than a specific error rate according to the bit resolution value of the ADC.

13. The operation method of claim 12, wherein the parameter related to the energy consumption of the terminal further comprises:
at least one of a channel intensity between the base station and the terminal, an intensity of interference with the signal received from the base station, thermal noise of the signal received from the base station, an energy consumption amount of the terminal, a residual energy amount of the terminal, a bit resolution range settable by the ADC, or a signal-to-quantization noise ratio (SQNR) of the signal received from the base station according to the bit resolution value of the ADC.

14. The operation method of claim 11, wherein the bit resolution value of the ADC for reducing the energy consumption of the terminal is determined by the terminal by comparing the measured parameter with a pre-set threshold value.

15. The operation method of claim 9, further comprising:
receiving, from the terminal, a parameter related to the energy consumption of the terminal obtained by the terminal;
determining the bit resolution value of the ADC for reducing the energy consumption of the terminal, based on the received parameter; and
transmitting the determined bit resolution value to the terminal.

16. The operation method of claim 9, further comprising:
receiving a smaller value, between a CQI value measured by the terminal and the CQI value corresponding to the maximum MCS value, reported as a CQI value from the terminal,
wherein the determining of the MCS value comprises:
determining a smaller value between an MCS value corresponding to the reported CQI value and the maximum MCS value as the MCS value.

17. The operation method of claim 16, further comprising:
encoding data according to the determined MCS value; and
transmitting the data encoded according to the determined MCS value to the terminal.

18. A terminal comprising:
a transceiver;
at least one memory configured to store a program for reducing energy consumption of the terminal by adjusting a bit resolution value of an analog-to-digital converter (ADC); and
at least one processor configured to control; by executing the program, a parameter related to the energy consumption of the terminal to be obtained, the bit resolution value of the ADC for reducing the energy consumption of the terminal to be determined based on the obtained parameter, and the bit resolution value of the ADC to be set as the determined value.

19. A base station comprising:
a transceiver;
at least one memory configured to store a program for reducing energy consumption of a terminal by adjusting a hit resolution value of an analog-to-digital converter (ADC) of the terminal; and
at least one processor configured to, by executing the program, receive, from the terminal, at least one of a maximum modulation and coding scheme (MCS) value or a channel quality indicator (CQI) value corresponding to the maximum MCS value usable by the base station for the terminal according to the bit resolution value of the ADC for reducing the energy consumption of the terminal and determine an MCS value based on at least one of the maximum MCS value or the CQI value corresponding to the maximum MCS value.

* * * * *